US009424944B2

(12) United States Patent
Sun et al.

(10) Patent No.: US 9,424,944 B2
(45) Date of Patent: Aug. 23, 2016

(54) DETECTING VOLTAGE THRESHOLD DRIFT

(71) Applicant: FUSION-IO, LLC, Salt Lake City, UT (US)

(72) Inventors: Hairong Sun, Superior, CO (US); Jea Hyun, Los Altos, CA (US); Rick Lucky, Louisville, CO (US); John Strasser, Kaysville, UT (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/599,240

(22) Filed: Jan. 16, 2015

(65) Prior Publication Data

US 2016/0125951 A1    May 5, 2016

Related U.S. Application Data

(60) Provisional application No. 62/073,853, filed on Oct. 31, 2014.

(51) Int. Cl.
*G11C 16/04* (2006.01)
*G11C 16/34* (2006.01)
*G11C 16/26* (2006.01)

(52) U.S. Cl.
CPC .......... *G11C 16/3404* (2013.01); *G11C 16/26* (2013.01)

(58) Field of Classification Search
CPC .............. G11C 16/10; G11C 16/0483; G11C 16/3459; G11C 16/3431; G11C 16/349; G11C 11/5628; G11C 16/3404; G11C 2029/4402; G11C 5/148
USPC ............ 365/185.17, 185.09, 185.25, 185.11, 365/185.18, 185.22, 222, 185.33, 200
See application file for complete search history.

(56) References Cited

U.S. PATENT DOCUMENTS

2012/0268994 A1   10/2012   Nagashima
2013/0019054 A1*  1/2013   Jung .................. G06F 12/0246
                                                                711/103

FOREIGN PATENT DOCUMENTS

WO    2009015313 A1    1/2009

* cited by examiner

*Primary Examiner* — Thong Q Le
(74) *Attorney, Agent, or Firm* — Kunzler Law Group, PC

(57) ABSTRACT

Apparatuses, systems, methods, and computer program products are disclosed for detecting voltage threshold drift. A method includes programming a predetermined pattern to one page of at least three pages of a set of memory cells. A pattern may have a configuration to reduce a number of bit transitions between abodes of a set of memory cells based on a coding scheme for the set of memory cells. A method includes reading data from a different page of at least three pages. A method includes determining a direction for adjusting a read voltage threshold for a set of memory cells based on read data.

20 Claims, 8 Drawing Sheets

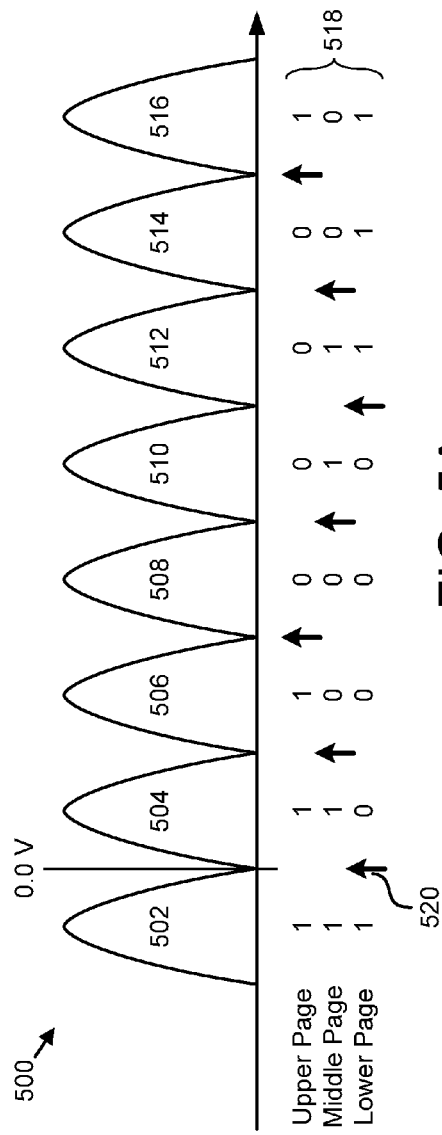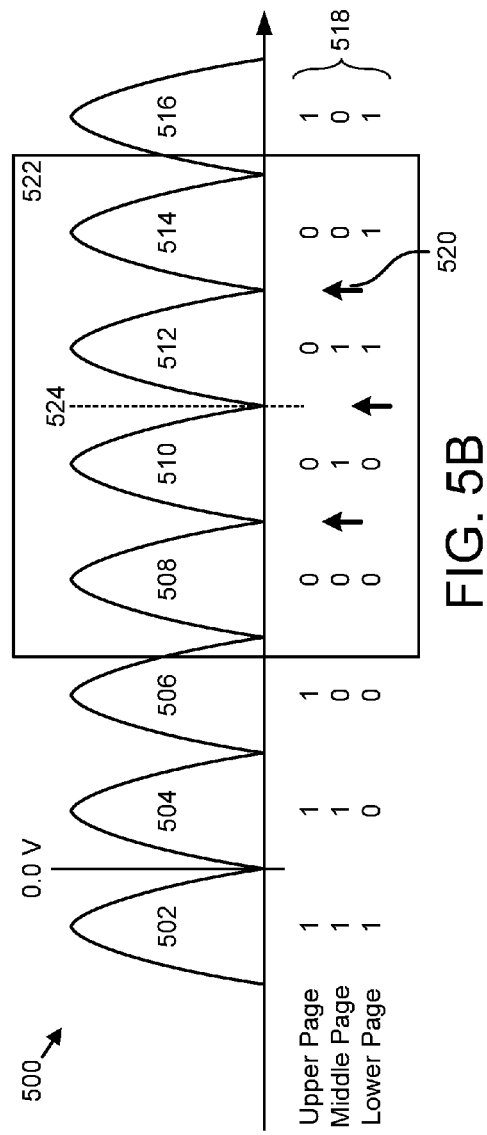

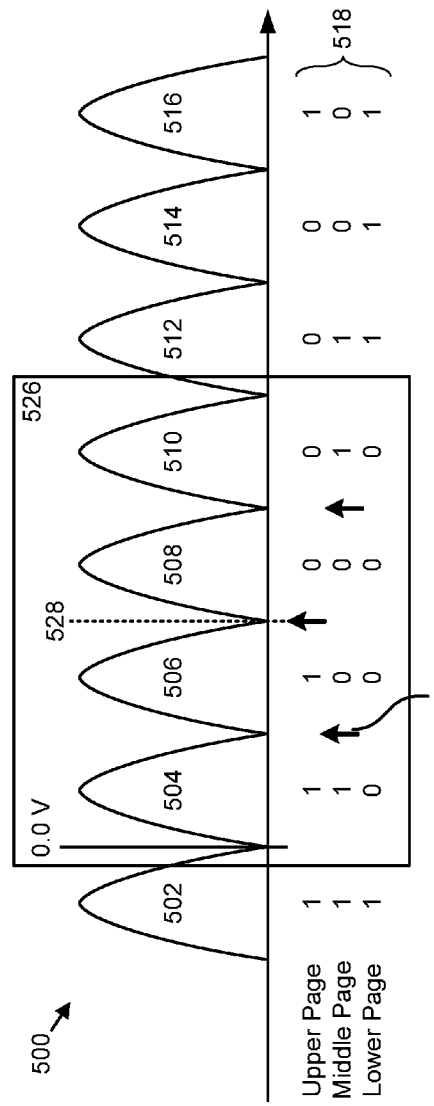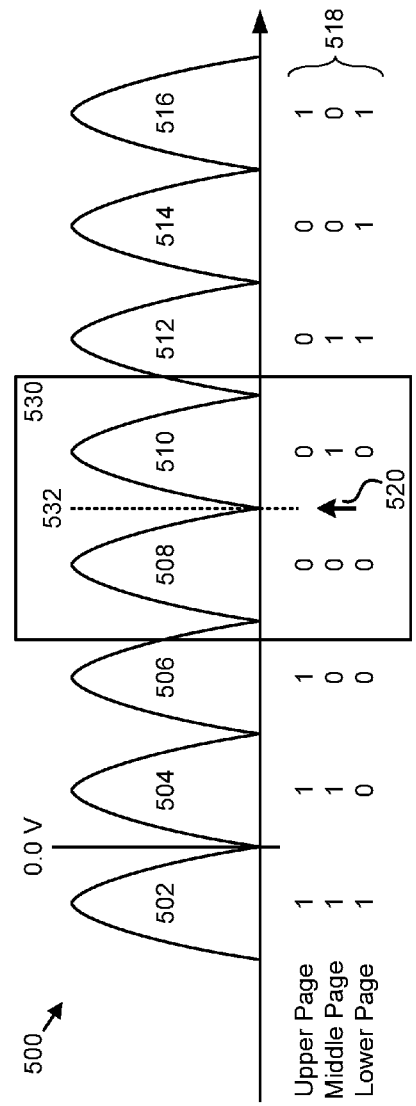

DETECTING VOLTAGE THRESHOLD DRIFT

CROSS-REFERENCES TO RELATED APPLICATIONS

This application claims the benefit of U.S. Provisional Patent Application No. 62/073,853 entitled "Detecting Voltage Threshold Drift" and filed on Oct. 31, 2014, for Hairong Sun, et al., which is incorporated herein by reference.

TECHNICAL FIELD

The present disclosure, in various embodiments, relates to detecting voltage threshold drift for solid state memory devices, and more particularly relates to detecting voltage threshold drift from bit error bias for NAND devices comprising multi-level storage cells storing at least three bits.

BACKGROUND

Non-volatile memory devices, such as NAND flash memory devices, may use read voltage thresholds to distinguish between discrete stored data values. However, stored read voltage levels may drift over time, due to charge leakage, due to read disturb and/or program disturb effects, or the like.

Adjustments to read voltage thresholds may be made to account for changes in stored read voltage levels, to prevent or correct errors. Certain encodings for data, especially data stored in storage cells that store many bits of data, have multiple bit transition points from 1 to 0 or from 0 to 1 for each page stored by the storage cells. Multiple bit transitions can make it difficult to quickly and efficiently determine an adjustment for a read voltage threshold, since it may not be readily apparent over which read voltage threshold the stored voltage level has crossed.

SUMMARY

Methods are presented for detecting voltage threshold drift. In one embodiment, a method includes programming a predetermined pattern to one page of at least three pages of a set of memory cells. A pattern, in certain embodiments, has a configuration to reduce a number of bit transitions between abodes of memory cells based on a coding scheme for the memory cells. A method, in a further embodiment, includes reading data from a different page of at least three pages. A method, in one embodiment, includes determining a direction for adjusting a read voltage threshold for a set of memory cells based on read data.

Apparatuses are presented to detect voltage threshold drift. In one embodiment, a data pattern module or data pattern component is configured to determine a pattern of data in a first page of a plurality of storage cells in a storage device. A determined pattern of data, in certain embodiments, minimizes a number of bit transitions between program states of storage cells. A shift module or shift component, in one embodiment, is configured to detect a direction of voltage drift based on data read from a second page of a plurality of storage cells. In a further embodiment, a voltage threshold module or voltage threshold component is configured to adjust a read voltage threshold for storage cells based on a detected direction of voltage drift.

Systems are presented to detect voltage threshold drift. A system, in one embodiment, includes a non-volatile recording medium comprising at least one word line configured to store at least three pages of data. A system, in a further embodiment, includes a controller for a non-volatile recording medium configured to program a predetermined pattern to a first page of at least three pages of a word line and to determine a direction of voltage shift for the word line based on data read from a second page of the word line.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which:

FIG. 5A is a diagram illustrating one embodiment of an encoding model for a multi-level storage cell of solid-state storage media storing at least three bits;

FIG. 5B is a diagram illustrating another embodiment of an encoding model for a multi-level storage cell of solid-state storage media storing at least three bits;

FIG. 5C is a diagram illustrating another embodiment of an encoding model for a multi-level storage cell of solid-state storage media storing at least three bits;

FIG. 5D is a diagram illustrating another embodiment of an encoding model for a multi-level storage cell of solid-state storage media storing at least three bits;

DETAILED DESCRIPTION

Figure 1:
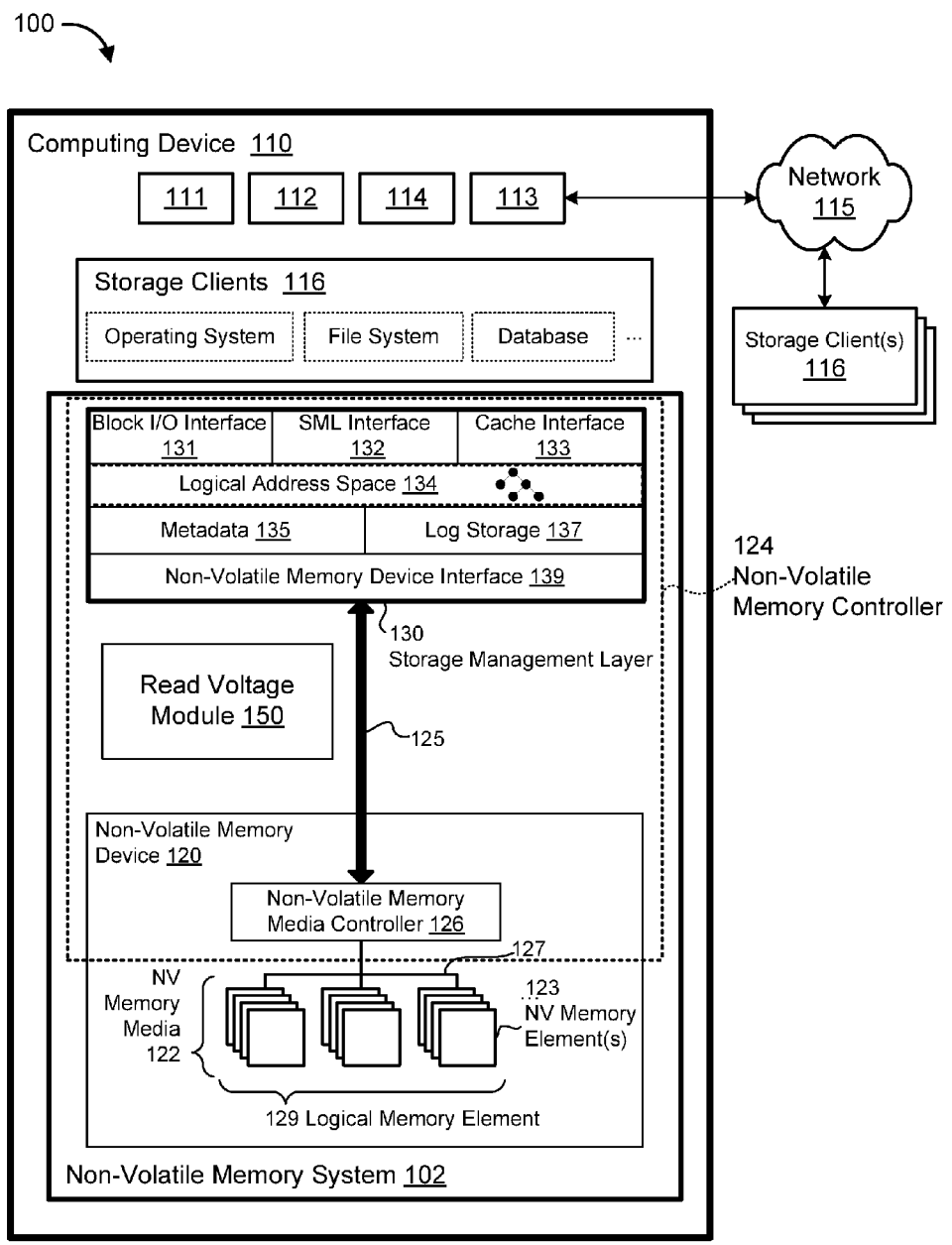
FIG. 1 is a schematic block diagram of one embodiment of a system comprising a voltage threshold drift module for detecting voltage threshold drift.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "component," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Java, Python, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1 is a block diagram of one embodiment of a system 100 comprising a read voltage module 150. The description herein with regard to the read voltage module 150 may apply equally to a read voltage component 150. The read voltage module 150 may be part of and/or in communication with one or more of a non-volatile memory controller 124, a non-volatile memory media controller 126, a device driver, or storage management layer (SML) 130, or the like. The read voltage module 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or non-volatile memory controller 124 to a communication network 115, such as an Internet Protocol network, a Storage Area Network, or the like.

The computing device 110 may further comprise a non-transitory, computer readable storage media 114. The computer readable storage media 114 may comprise executable instructions configured to cause the computing device 110 (e.g., processor 111) to perform steps of one or more of the methods disclosed herein. Alternatively, or in addition, the read voltage module 150 may be embodied as one or more computer readable instructions stored on the non-transitory storage media 114.

The non-volatile memory system 102, in the depicted embodiment, includes a read voltage module 150. The read voltage module 150, in certain embodiments, determines, adjusts, or otherwise manages read voltage thresholds (e.g., boundaries between adjacent abodes or storage states) for the non-volatile memory media 122, as stored voltage levels drift or change over time. As described above, read operations may cause a read disturb effect, program operations may cause a program disturb effect, charge may leak over time, or other factors may affect the stored voltage levels of storage cells of the non-volatile memory media 122.

The read voltage module 150, in one embodiment, is configured to program a predetermined pattern to and/or identify a predetermined pattern in one page of at least three pages of a set of memory cells. The read voltage module 150 may program or identify a pattern that has a configuration to reduce a number of possible bit transitions between abodes or states of the memory cells, based on a coding scheme for the set of memory cells (e.g., a Gray code) or the like. The read voltage module 150, in a further embodiment, may read data from a different page of the at least three pages and determine a direction for adjusting a read voltage threshold for the set of memory cells based on the read data. The read voltage module 150 may also adjust the read voltage threshold for the set of memory cells, for other memory cells, or the like, in the determined direction. In some embodiments, the read voltage module 150 iteratively re-reads data from the different page and re-adjusts the read voltage threshold for the set of memory cells based on the re-read data until an error in the data from the different page becomes correctable, until a retry threshold has been reached, or the like.

Programming a first page with a predetermined pattern and determining a direction for adjusting a read voltage threshold for the set of memory cells based on data from a different page, in certain embodiments, allows the read voltage module 150 to quickly determine a read voltage threshold at a low expense, with minimal overhead, or the like. For example, in certain embodiments, the read voltage module 150 may use a predefined pattern of data in one page to minimize or reduce a number of possible bit transitions in another page of the same storage cells (e.g., reducing the number of transition points to a single transition point or the like). Reducing a number of possible bit transitions, bit transition points, or the like, between abodes or storage states may allow the read voltage module 150 to determine which direction a stored read voltage level has drifted or changed, which may be difficult or impossible with multiple possible bit transition points.

In one embodiment, a single page of a single word line of an erase block, a set of several pages from several word lines of an erase block, or the like is used for system management (e.g., for read voltage threshold management) rather than being available to store user data. However, as an erase block may comprise 512 pages, 2048 pages, or more, capacity is reduced by 0.2% or less for each page used for read voltage threshold management. In some embodiments, two pages of a word line may be used to improve the accuracy of the read voltage threshold management, for certain encodings, or the like.

In one embodiment, the read voltage module 150 may comprise executable software code, such as a device driver, SML 130, or the like, stored on the computer readable storage media 114 for execution on the processor 111. In another embodiment the read voltage module 150 may comprise logic hardware of one or more non-volatile memory devices 120, such as a non-volatile memory media controller 126, a non-volatile memory controller 124, a device controller, a field-programmable gate array (FPGA) or other programmable logic, firmware for an FPGA or other programmable logic, microcode for execution on a microcontroller, an application-specific integrated circuit (ASIC), or the like. In a further embodiment, the read voltage module 150 may include a combination of both executable software code and logic hardware.

In one embodiment, the read voltage module 150 is configured to receive storage requests from the SML 130 via a bus 125 or the like. The read voltage module 150 may be further configured to transfer data to/from the SML 130 and/or storage clients 116 via the bus 125. Accordingly, the read voltage module 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the read voltage module 150 may receive storage requests as an API call from a storage client 116, as an IO-CTL command, or the like. The read voltage module 150 is described in greater detail below with regard to FIGS. 3 and 4.

According to various embodiments, a non-volatile memory controller 124 comprising the read voltage module 150 may manage one or more non-volatile memory devices 120. The non-volatile memory device(s) 120 may comprise recording, memory, and/or storage devices, such as solid-state storage device(s), that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, erase blocks, sectors, blocks, collections or sets of physical storage locations (e.g., logical pages, logical erase blocks, described below), or the like.

The non-volatile memory controller 124 may comprise an SML 130, which may present a logical address space 134 to one or more storage clients 116. One example of an SML is the Virtual Storage Layer® of SanDisk Corporation of Milpitas, Calif. Alternatively, each non-volatile memory device 120 may comprise a non-volatile memory media controller 126, which may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/ sector (CHS) address, a file name, an object identifier, an inode, a Universally Unique Identifier (UUID), a Globally Unique Identifier (GUID), a hash code, a signature, an index entry, a range, an extent, or the like.

The SML 130 may maintain metadata 135, such as a forward index, to map logical addresses of the logical address space 134 to media storage locations on the non-volatile memory device(s) 120. The SML 130 may provide for arbitrary, any-to-any mappings from logical addresses to physical storage resources. As used herein, an "any-to any" mapping may map any logical address to any physical storage resource. Accordingly, there may be no pre-defined and/or pre-set mappings between logical addresses and particular, media storage locations and/or media addresses. As used herein, a media address refers to an address of a memory resource that uniquely identifies one memory resource from another to a controller that manages a plurality of memory resources. By way of example, a media address includes, but is not limited to: the address of a media storage location, a physical memory unit, a collection of physical memory units (e.g., a logical memory unit), a portion of a memory unit (e.g., a logical memory unit address and offset, range, and/or extent), or the like. Accordingly, the SML 130 may map logical addresses to physical data resources of any size and/or granularity, which may or may not correspond to the underlying data partitioning scheme of the non-volatile memory device(s) 120. For example, in some embodiments, the non-volatile memory controller 124 is configured to store data within logical memory units that are formed by logically combining a plurality of physical memory units, which may allow the non-volatile memory controller 124 to support many different virtual memory unit sizes and/or granularities.

As used herein, a logical memory element refers to a set of two or more non-volatile memory elements that are or are capable of being managed in parallel (e.g., via an I/O and/or control bus). A logical memory element may comprise a plurality of logical memory units, such as logical pages, logical memory divisions (e.g., logical erase blocks), and so on. As used herein, a logical memory unit refers to a logical construct combining two or more physical memory units, each physical memory unit on a respective non-volatile memory element in the respective logical memory element (e.g., each non-volatile memory element being accessible in parallel). As used herein, a logical memory division refers to a set of two or more physical memory divisions, each physical memory division on a respective non-volatile memory element in the respective logical memory element.

The logical address space 134 presented by the SML 130 may have a logical capacity, which may correspond to the number of available logical addresses in the logical address space 134 and the size and/or granularity of the data referenced by the logical addresses. For example, the logical capacity of a logical address space 134 comprising 2^32 unique logical addresses, each referencing 2048 bytes (2KiB) of data may be 2^43 bytes. As used herein, a kibibyte (KiB) refers to 1024 bytes. In some embodiments, the logical address space 134 may be thinly provisioned. As used herein, a "thinly provisioned" logical address space 134 refers to a logical address space 134 having a logical capacity that exceeds the physical capacity of the underlying non-volatile memory device(s) 120. For example, the SML 130 may present a 64-bit logical address space 134 to the storage clients 116 (e.g., a logical address space 134 referenced by 64-bit logical addresses), which may exceed the physical capacity of the underlying non-volatile memory devices 120. The large logical address space 134 may allow storage clients 116 to allocate and/or reference contiguous ranges of logical addresses, while reducing the chance of naming conflicts. The SML 130 may leverage the any-to-any mappings between logical addresses and physical storage resources to manage the logical address space 134 independently of the underlying physical storage devices 120. For example, the SML 130 may add and/or remove physical storage resources seamlessly, as needed, and without changing the logical addresses used by the storage clients 116.

The non-volatile memory controller 124 may be configured to store data in a contextual format. As used herein, a contextual format refers to a self-describing data format in which persistent contextual metadata is stored with the data on the physical storage media 122. The persistent contextual metadata provides context for the data with which it is stored. In certain embodiments, the persistent contextual metadata uniquely identifies the data with which the persistent contextual metadata is stored. For example, the persistent contextual metadata may uniquely identify a sector or block of data owned by a storage client 116 from other sectors or blocks of data owned by the storage client 116. In a further embodiment, the persistent contextual metadata identifies an operation that is performed on the data. In a further embodiment, the persistent contextual metadata identifies a sequence of operations performed on the data. In a further embodiment, the persistent contextual metadata identifies security controls, a data type, or other attributes of the data. In a certain embodiment, the persistent contextual metadata identifies at least one of a plurality of aspects, including data type, a unique data identifier, an operation, and a sequence of operations performed on the data.

The persistent contextual metadata may include, but is not limited to: a logical address of the data, an identifier of the data (e.g., a file name, object id, label, unique identifier, or the like), reference(s) to other data (e.g., an indicator that the data is associated with other data), a relative position or offset of the data with respect to other data (e.g., file offset, etc.), data size and/or range, and the like. The contextual data format may comprise a packet format comprising a data segment and one or more headers. Alternatively, a contextual data format may associate data with context information in other ways (e.g., in a dedicated index on the non-volatile memory media 122, a memory division index, or the like).

In some embodiments, the contextual data format may allow data context to be determined and/or reconstructed based upon the contents of the non-volatile memory media 122, and independently of other metadata, such as the arbitrary, any-to-any mappings discussed above. Since the media location of data is independent of the logical address of the data, it may be inefficient or impossible to determine the context of data based solely upon the media location or media address of the data. Storing data in a contextual format on the non-volatile memory media 122 may allow data context to be determined without reference to other metadata. For example, the contextual data format may allow the metadata to be reconstructed based only upon the contents of the non-volatile memory media 122 (e.g., reconstruct the any-to-any mappings between logical addresses and media locations).

In some embodiments, the non-volatile memory controller 124 may be configured to store data on one or more asymmetric, write-once media 122, such as solid-state storage media. As used herein, a "write once" storage medium refers to a storage medium that is reinitialized (e.g., erased) each time new data is written or programmed thereon. As used herein, an "asymmetric" storage medium refers to a storage medium 122 having different latencies for different storage operations. Many types of solid-state storage media are asymmetric; for example, a read operation may be much faster than a write/program operation, and a write/program operation may be much faster than an erase operation (e.g., reading the media may be hundreds of times faster than erasing, and tens of times faster than programming the media).

The memory media 122 may be partitioned into memory divisions that can be erased as a group (e.g., erase blocks) in order to, inter alia, account for the asymmetric properties of the media 122, or the like. As such, modifying a single data segment in-place may require erasing the entire erase block comprising the data, and rewriting the modified data to the erase block, along with the original, unchanged data. This may result in inefficient "write amplification," which may excessively wear the media 122. Therefore, in some embodiments, the non-volatile memory controller 124 may be configured to write data out-of-place. As used herein, writing data "out-of-place" refers to writing data to different media storage location(s) rather than overwriting the data "in-place" (e.g., overwriting the original physical location of the data). Modifying data out-of-place may avoid write amplification, since existing, valid data on the erase block with the data to be modified need not be erased and recopied. Moreover, writing data out-of-place may remove erasure from the latency path of many storage operations (e.g., the erasure latency is no longer part of the critical path of a write operation).

The non-volatile memory controller 124 may comprise one or more processes that operate outside of the regular path for servicing of storage operations (e.g., the "path" for performing a storage operation and/or servicing a storage request). As used herein, the "path for servicing a storage request" or "path for servicing a storage operation" (also referred to as the "critical path") refers to a series of processing operations needed to service the storage operation or request, such as a read, write, modify, or the like. The path for servicing a storage request may comprise receiving the request from a storage client 116, identifying the logical addresses of the request, performing one or more storage operations on non-volatile memory media 122, and returning a result, such as acknowledgement or data. Processes that occur outside of the path for servicing storage requests may include, but are not limited to: a groomer, de-duplication, and so on. These processes may be implemented autonomously and in the background, so that they do not interfere with or impact the performance of other storage operations and/or requests. Accordingly, these processes may operate independent of servicing storage requests.

In some embodiments, the non-volatile memory controller 124 comprises a groomer, which is configured to reclaim memory divisions (e.g., logical or physical erase blocks) for reuse, using a garbage collection or other storage capacity recovery process. The write out-of-place paradigm implemented by the non-volatile memory controller 124 may result in obsolete or invalid data remaining on the non-volatile memory media 122. For example, overwriting data X with data Y may result in storing Y on a new memory division (e.g., rather than overwriting X in place), and updating the any-to-any mappings of the metadata to identify Y as the valid, up-to-date version of the data. The obsolete version of the data X may be marked as invalid, but may not be immediately removed (e.g., erased), since, as discussed above, erasing X may involve erasing an entire memory division, which is a time-consuming operation and may result in write amplification. Similarly, data that is no longer is use (e.g., deleted or trimmed data) may not be immediately removed. The non-volatile memory media 122 may accumulate a significant amount of invalid data.

A groomer process may operate outside of the critical path for servicing storage operations. The groomer process may reclaim memory divisions so that they can be reused for other storage operations. As used herein, reclaiming a memory division refers to erasing the memory division so that new data may be stored/programmed thereon. Reclaiming a memory division may comprise relocating valid data on the memory division to a new location. The groomer may identify memory divisions for reclamation based upon one or more factors, which may include, but are not limited to: the amount of invalid data in the memory division, the amount of valid data in the memory division, wear on the memory division (e.g., number of erase cycles), time since the memory division was programmed or refreshed, and so on.

The non-volatile memory controller 124 may be further configured to store data in a log format. As described above, a log format refers to a data format that defines an ordered sequence of storage operations performed on a non-volatile memory media 122. In some embodiments, the log format comprises storing data in a predetermined sequence of media addresses of the non-volatile memory media 122 (e.g., within sequential pages and/or erase blocks of the media 122). The log format may further comprise associating data (e.g., each packet or data segment) with respective sequence indicators. The sequence indicators may be applied to data individually (e.g., applied to each data packet) and/or to data groupings (e.g., packets stored sequentially on a memory division, such as an erase block). In some embodiments, sequence indicators may be applied to memory divisions when the memory divisions are reclaimed (e.g., erased), as described above, and/or when the memory divisions are first used to store data.

In some embodiments the log format may comprise storing data in an "append only" paradigm. The non-volatile memory controller 124, using the log storage module 137 described below or the like, may maintain a current append point at a media address of the non-volatile memory device 120. The append point may be a current memory division and/or offset within a memory division. Data may then be sequentially appended from the append point. The sequential ordering of the data, therefore, may be determined based upon the sequence indicator of the memory division of the data in combination with the sequence of the data within the memory division. Upon reaching the end of a memory division, the non-volatile memory controller 124 may identify the "next" available memory division (e.g., the next memory division that is initialized and ready to store data). The groomer may reclaim memory divisions comprising invalid, stale, and/or deleted data, to ensure that data may continue to be appended to the media log.

The log format described herein may allow valid data to be distinguished from invalid data based upon the contents of the non-volatile memory media 122, and independently of other metadata. As discussed above, invalid data may not be removed from the non-volatile memory media 122 until the memory division comprising the data is reclaimed. Therefore, multiple "versions" of data having the same context may exist on the non-volatile memory media 122 (e.g., multiple versions of data having the same logical addresses). The sequence indicators associated with the data may be used to distinguish invalid versions of data from the current, up-to-date version of the data; the data that is the most recent in the log is the current version, and previous versions may be identified as invalid.

The storage management layer 130 may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

The storage management layer 130 comprises and/or is communicatively coupled to one or more non-volatile memory devices 120. The one or more non-volatile memory devices 120 may include different types of non-volatile memory devices including, but not limited to: solid-state storage devices, hard drives, SAN storage resources, or the like. The one or more non-volatile memory devices 120 may comprise one or more respective non-volatile memory media controllers 126 and non-volatile memory media 122. As illustrated in FIG. 1, The SML 130 may provide access to the one or more non-volatile memory devices 120 via a traditional block I/O interface 131. Additionally, the SML 130 may provide access to enhanced functionality (e.g., a large, virtual address space 134) through the SML interface 132. The metadata 135 may be used to manage and/or track storage operations performed through any of the Block I/O interface 131, SML interface 132, cache interface 133, or other, related interfaces.

The cache interface 133 may expose cache-specific features accessible via the storage management layer 130. Also, in some embodiments, the SML interface 132 presented to the storage clients 116 provides access to data transformations implemented by the one or more non-volatile memory devices 120 and/or the one or more non-volatile memory media controllers 126.

The SML 130 may provide storage services through one or more interfaces, which may include, but are not limited to: a block I/O interface, an extended storage management layer interface, a cache interface, and the like. The SML 130 may present a logical address space 134 to the storage clients 116 through one or more interfaces. As discussed above, the logical address space 134 may comprise a plurality of logical addresses, each corresponding to respective media locations the on one or more non-volatile memory devices 120. The SML 130 may maintain metadata 135 comprising any-to-any mappings between logical addresses and media locations, as described above.

The SML 130 may further comprise a log storage module 137 that is configured to store data in a contextual, log format. The contextual, log data format may comprise associating data with persistent contextual metadata, such as the logical address of the data, or the like. The contextual, log format may further comprise associating data with respective sequence identifiers on the non-volatile memory media 122, which define an ordered sequence of storage operations performed on the one or more non-volatile memory devices 120, as described above.

The SML 130 may further comprise a non-volatile memory device interface 139 configured to transfer data, commands, and/or queries to the one or more non-volatile memory devices 120 over a bus 125, which may include, but is not limited to: a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the non-volatile memory controller 124 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The non-volatile memory controller 124 comprises one or more non-volatile memory devices 120. Although FIG. 1 depicts a single non-volatile memory device 120, the disclosure is not limited in this regard and could be adapted to incorporate any number of non-volatile memory devices 120.

The non-volatile memory device 120 may comprise non-volatile memory media 122, which may include but is not limited to: NAND flash memory, NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), resistive RAM (RRAM), programmable metallization cell (PMC), conductive-bridging RAM (CBRAM), magneto-resistive RAM (MRAM), dynamic RAM (DRAM), phase change RAM (PRAM or PCM), magnetic storage media (e.g., hard disk, tape), optical storage media, or the like. While the non-volatile memory media 122 is referred to herein as "memory media," in various embodiments, the non-volatile memory media 122 may more generally comprise a non-volatile recording media capable of recording data, which may be referred to as a non-volatile memory media, a non-volatile storage media, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, and the like. A non-volatile memory media controller 126 may be configured to manage storage operations on the non-volatile memory media 122, and may comprise one or more processors, programmable processors (e.g., field-programmable gate arrays), or the like. In some embodiments, the non-volatile memory media controller 126 is configured to store data on and/or read data from the non-volatile memory media 122 in the contextual, log format described above, and to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. As discussed above, the logical memory element may be partitioned into respective logical memory units (e.g., logical pages) and/or logical memory divisions (e.g., logical erase blocks). The logical memory units may be formed by logically combining physical memory units of each of the non-volatile memory elements. For example, if the non-volatile memory media 122 comprises twenty-five (25) non-volatile memory elements, each logical memory unit may comprise twenty-five (25) pages (e.g., a page of each element of non-volatile memory media 122).

The non-volatile memory controller 124 may comprise an SML 130 and the non-volatile memory media controller 126. The SML 130 may provide storage services to the storage clients 116 via one or more interfaces 131, 132, and/or 133. In some embodiments, the SML 130 provides a block-device I/O interface 131 through which storage clients 116 perform block-level I/O operations. Alternatively, or in addition, the SML 130 may provide a storage management layer (SML) interface 132, which may provide other storage services to the storage clients 116. In some embodiments, the SML interface 132 may comprise extensions to the block device interface 131 (e.g., storage clients 116 may access the SML interface 132 through extensions to the block device interface 131). Alternatively, or in addition, the SML interface 132 may be provided as a separate API, service, and/or library. The SML 130 may be further configured to provide a cache interface 133 for caching data using the non-volatile memory system 102.

As described above, the SML 130 may present a logical address space 134 to the storage clients 116 (e.g., through the interfaces 131, 132, and/or 133). The SML 130 may maintain metadata 135 comprising any-to-any mappings between logical addresses in the logical address space 134 and media locations on the non-volatile memory device 120. The metadata 135 may comprise a logical-to-physical mapping structure with entries that map logical addresses in the logical address space 134 and media locations on the non-volatile memory device 120. The logical-to-physical mapping structure of the metadata 135, in one embodiment, is sparsely populated, with entries for logical addresses for which the non-volatile memory device 120 stores data and with no entries for logical addresses for which the non-volatile memory device 120 does not currently store data. The metadata 135, in certain embodiments, tracks data at a block level, with the SML 130 managing data as blocks.

The non-volatile memory system 102 may further comprise a log storage module 137, which, as described above, may be configured to store data on the non-volatile memory device 120 in a contextual, log format. The contextual, log data format may comprise associating data with a logical address on the non-volatile memory media 122. The contextual, log format may further comprise associating data with respective sequence identifiers on the non-volatile memory media 122, which define an ordered sequence of storage operations performed on the non-volatile memory media 122, as described above. The non-volatile memory controller 124 may further comprise a non-volatile memory device interface 139 that is configured to transfer data, commands, and/or queries to the non-volatile memory media controller 126 over a bus 125, as described above.

Figure 2:
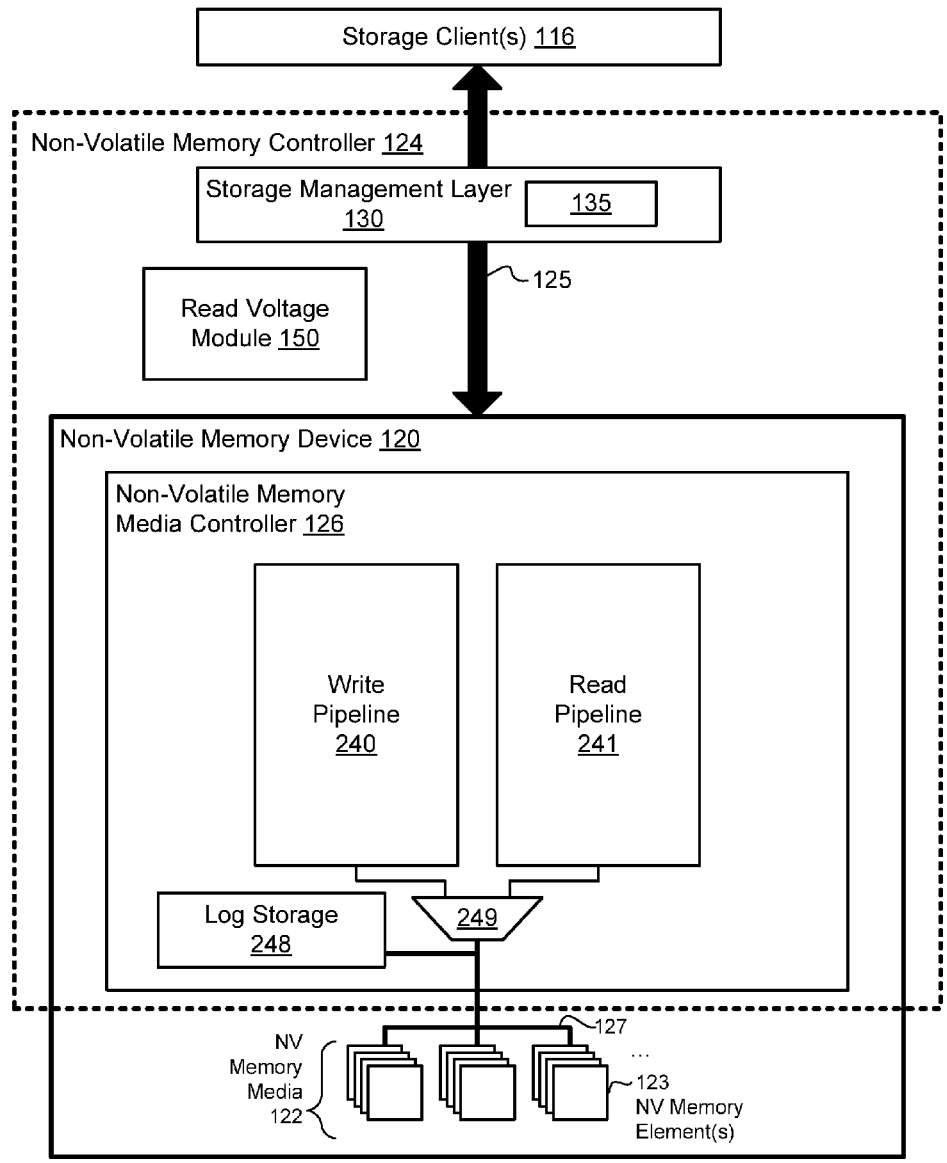
FIG. 2 is a schematic block diagram illustrating another embodiment of a system comprising a voltage threshold drift module for detecting voltage threshold drift.

FIG. 2 depicts another embodiment of a non-volatile memory controller 124 configured to manage storage within the -volatile memory media 122. The non-volatile memory device 120 may comprise a non-volatile memory media controller 126 and non-volatile memory media 122. The non-volatile memory media 122 may comprise a plurality of non-volatile memory elements 123, which may be communicatively coupled to the non-volatile memory media controller 126 via a bus 127, as described above.

The non-volatile memory media controller 126 may comprise a write pipeline 240 that is configured to store data on the non-volatile memory media 122 in a contextual format in response to write requests received from storage clients 116 or the like. The requests may include and/or reference data to be stored on the non-volatile memory media 122, may include logical address(es) of the data, and so on. As described above, the contextual format may comprise storing a logical address of the data in association with the data on the non-volatile memory media 122. For example, the write pipeline 240 may be configured to format data into packets, and may include the logical address of the data in a packet header or other packet field. The write pipeline 240 may be configured to buffer data for storage on the non-volatile memory media 122. In some embodiments, the write pipeline 240 may comprise one or more synchronization buffers to synchronize a clock domain of the non-volatile memory media controller 126 with a clock domain of the non-volatile memory media 122 and/or bus 127.

The log storage module 248 may be configured to select media location(s) for the data and may provide addressing and/or control information to the non-volatile memory elements 123 via the bus 127. In some embodiments, the log storage module 248 is configured to store data sequentially in a log format within the non-volatile memory media. The log storage module 248 may be further configured to groom the non-volatile memory media, as described above. In certain embodiments the log storage module 248 is substantially similar to the log storage module 137 as described above. The log storage module 248 may be executed by the SML 130 and/or by the non-volatile memory media controller 126.

Upon writing data to the non-volatile memory media, the non-volatile memory media controller 126 may be configured to update metadata 135 (e.g., a forward index) to associate the logical address(es) of the data with the media address(es) of the data on the non-volatile memory media 122. In some embodiments, the metadata 135 may be maintained on the non-volatile memory media controller 126; for example, the metadata 135 may be stored on the non-volatile memory media 122, on a volatile memory (not shown), or the like. Alternatively, or in addition, the metadata 135 may be maintained within the SML 130 (e.g., on a volatile memory 112 of the computing device 110 of FIG. 1). In some embodiments, the metadata 135 may be maintained in a volatile memory by the SML 130, and may be periodically stored on the non-volatile memory media 122.

The non-volatile memory media controller 126 may further comprise a read pipeline 241 that is configured to read contextual data from the non-volatile memory media 122 in response to read requests received from storage clients 116 or the like, using read voltage thresholds determined and/or adjusted by the read voltage module 150. The requests may comprise a logical address of the requested data, a media address of the requested data, and so on. The read pipeline 241 may be configured to read data stored in a contextual format from the non-volatile memory media 122 and to provide the data to the SML 130 and/or a storage client 116. The read pipeline 241 may be configured to determine the media address of the data using a logical address of the data and the metadata 135. Alternatively, or in addition, the SML 130 may determine the media address of the data and may include the media address in the request. The log storage module 248 may provide the media address to the non-volatile memory elements 123, and the data may stream into the read pipeline 241 via a buffer. The read pipeline 241 may comprise one or more read synchronization buffers for clock domain synchronization, as described above.

The non-volatile memory media controller 126 may further comprise a multiplexer 249 that is configured to selectively route data and/or commands to/from the write pipeline 240 and the read pipeline 241. In some embodiments, non-volatile memory media controller 126 may be configured to read data while filling a buffer of the write pipeline 240 and/or may interleave one or more storage operations on one or more banks of non-volatile memory elements 123 (not shown).

Figure 3:
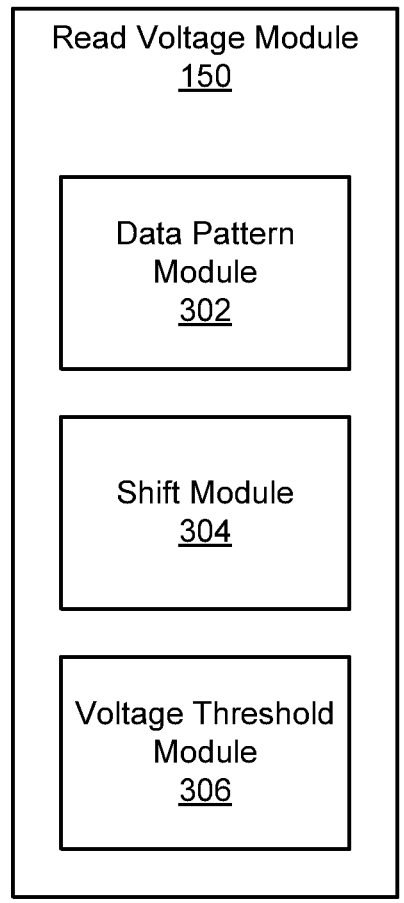
FIG. 3 is a block diagram illustrating one embodiment of a voltage threshold drift module.

FIG. 3 depicts one embodiment of a read voltage module 150. The read voltage module 150 may be substantially similar to the read voltage module 150 described above with regard to FIG. 1. In general, as described above, the read voltage module 150, in certain embodiments, determines a pattern of data in a first page of a set of memory cells, estimates and/or detects a direction of voltage drift based on data read from a second/different page of the plurality of storage cells, and/or adjusts a read voltage threshold for the storage cells based on the estimated and/or detected direction of voltage drift. In the depicted embodiment, the read voltage module 150 includes a data pattern module 302, a shift module 304, and a voltage threshold module 306. The description herein with regard to the data pattern module 302, the shift module 304, and the voltage threshold module 306 may apply equally to a data pattern component 302, a shift component 304, and a voltage threshold component 306.

The data pattern module 302, in one embodiment, is configured to determine a pattern of data in or for a first page of a plurality of storage cells of a storage device 120. In certain embodiments, the determined pattern of data is a pattern that minimizes or reduces the number of possible bit transitions between abodes or program states of the storage cells. For example, based on a certain encoding, the predetermined pattern may comprise all binary zeroes so that the distribution of data among the other pages of the storage cells has a data distribution substantially similar to a two-bit MLC encoding, with a single possible transition point between different bit values for at least one remaining page of the storage cells.

A pattern of data or data pattern, as used herein, comprises at least two bits of data having predefined data values (e.g., binary ones, binary zeroes, a predefined combination or sequence of binary ones and binary zeroes, or the like). In certain embodiments, a data pattern is associated with bits or storage cells that are sequential and/or contiguous. In other embodiments, a data pattern may be associated with non-contiguous bits or storage cells (e.g., the data pattern module 302 may locate a sequence that includes one or more non-contiguous bits that satisfy a pattern of data, skipping or passing over one or more bits that fail to satisfy the pattern of data). For example, to locate a predefined data pattern comprising exclusively binary zeroes in existing or stored data, the data pattern module 302 may skip over or exclude storage cells storing a binary one value in a specified page, determining which storage cells store a binary zero value in the specified page and selecting those storage cells for the predefined pattern. In one embodiment, the data pattern module 302 is configured to dynamically determine a pattern of data itself, based on an encoding or coding scheme for the non-volatile memory media 122. In a further embodiment, the data pattern module 302 may determine a data pattern by receiving the data pattern from another module or entity; by referencing or retrieving a predetermined data pattern defined by a manufacturer, vendor, administrator, designer, data scientist, or the like;

In some embodiments, the plurality of storage cells comprises a word line of the storage device 120, the word line configured to store three or more pages of data, such as triple level cell (TLC) NAND flash with three bits per cell, quadruple level cell (QLC) NAND flash with four bits per cell, or more bits per cell. In some embodiments, the at least three pages of the plurality of storage cells comprises an upper page, a middle page, and a lower page. In some embodiments, the first page, for which the data pattern module 302 determines a pattern, may be the upper page. In other embodiments, the first page, for which the data pattern module 302 determines a pattern, may be the lower page or a middle page. As discussed in further detail below with regard to FIGS. 5A-5D, the first page may be selected based on a coding scheme or data encoding for the plurality of storage cells so as to produce a two-bit MLC-like mapping or encoding among the remaining page or pages.

In certain embodiments, the data pattern module 302 determines data patterns for multiple pages of the set of storage cells (e.g., an upper page and a lower page, an upper page and a middle page, a lower page and a middle page). In a further embodiment, the data pattern module 302 may determine data patterns for all but one page of a word line or other set of storage cells (e.g., two of three TLC pages, three of four QLC pages) such that each storage cell of the set is placed in one or the other of two abodes or program states, with a single bit transition point between them, as described in greater detail below with regard to FIG. 5D.

In some embodiments, the storage cells comprise multi-level storage cells that store at least three bits (e.g., TLC, QLC). In some embodiments, the first page is one of at least three pages of the plurality of storage cells. For example, as described below with regard to FIG. 5A, a multi-level storage cell storing at least three bits may be associated with a page group. A page group is a set of at least three pages (e.g., upper, middle, and lower) that are associated with a single set of physical multi-level storage cells, such as a word line. For example, a multi-level storage cell may be associated with a page group or word line that includes an upper page, a middle page, and a lower page, each page storing its own bit of the at least three bits.

Thus, each bit in the same multi-level storage cell may be separately addressable and accessible on different pages of the non-volatile memory system 102. In certain embodiments, the upper page includes the most significant bits (MSB) of a plurality of multi-level storage cells, and the lower page includes the least significant bits (LSBs) of the same multi-level storage cells. Writes directed to the upper page may therefore cause changes only in the MSBs of the associated multi-level storage cells, while writes directed to the lower page cause changes only in the LSBs of the associated multi-level storage cells.

In some embodiments, the data pattern module 302 is further configured to program a predetermined pattern to a first page of a plurality of pages of a set of storage cells, the predetermined pattern having a configuration to reduce a number of possible bit transitions between abodes of the memory cells based on a coding scheme or encoding for the set of storage cells. In certain embodiments, for a certain encoding scheme or the like, the predetermined pattern comprises all binary zeroes so that there is only a single transition point from binary one to binary zero (or vice versa) for abodes of one of the other pages of the plurality of storage cells. The predetermined pattern may comprises logical zeroes (e.g., from the perspective of the non-volatile memory controller 124 and/or of a storage client 116) or electrical zeroes (e.g., from the perspective of the non-volatile memory media 122, meaning little or no current is flowing through the channel substrate), according to the specific encoding scheme used by the non-volatile memory device 120 (e.g., the non-volatile memory media 122 may store electrical ones in an erase state, which may be inverted and interpreted as logical zeroes, or the like). For example, the upper page may be programmed with the pattern of data such that the middle and lower pages for the plurality of storage cells have to a two-bit Gray code mapping. In certain embodiments, the data pattern module 302 is configured to program one or more predefined patterns to a plurality of pages of a set of storage cells (e.g., two pages, all but one page, or the like).

In a further embodiment, instead of or in addition to programming one or more data patterns to pages of a word line or other set of storage cells, the data pattern module 302 may locate existing data stored in one or more pages of a word line or other set of storage cells that satisfies a predetermined data pattern, as described below with regard to the location module 406. By using existing data, which may comprise user data received from a storage client 116, from a host computing device 110, or the like, in certain embodiments, the overhead of storing a predetermined data pattern may be minimized or eliminated. Various embodiments in which the data pattern module 302 may locate or determine a predefined pattern within user data, existing data, or previously stored data are described in greater detail below with regard to the location module 406.

The shift module 304, in one embodiment, is configured to estimate and/or detect a direction of voltage drift, a direction in which a read voltage threshold should be adjusted, or the like based on data read from a second/different page of the same plurality of storage cells than a page for which the data pattern module 302 has determined a data pattern. The direction may be represented as a value, a sign (e.g., positive or negative), a relationship (e.g., greater than, less than), a direction (e.g., up, down), or the like. The shift module 304, in certain embodiments, may determine a direction of voltage drift based on an encoding type (e.g., Gray code) used for storage cells of the non-volatile memory media 122, based on a physical and/or electrical architecture of the storage cells of the non-volatile memory media 122, or the like. For example, the shift module 304 may examine the data read from a second/different page to determine a direction of voltage drift for the plurality of storage cells based on a storage media type (e.g., a 3-bit MLC or an n-bit-MLC such as TLC or QLC), which page (e.g., upper, middle, or lower) of a multi-phase programming model word line was read, and/or an encoding type for the non-volatile memory media 122 (such as a Gray code encoding type, a binary code encoding type, or the like). In further embodiments, the shift module 304 may determine a magnitude of voltage drift based on the data read from a second/different page.

The shift module 304, in one embodiment, may determine the direction by comparing an expected bias (including a ratio, proportion, or other representation of the expected bias) from a representation of the read bias of the data read from the second/different page. As used herein, a bias is a preference, probability, tendency, or desirability of values for bits within a set of bits to exhibit a specific data pattern. A bias may be a natural property, a designed attribute, a property of performing an operation on storage media, a random occurrence, and/or caused by errors or disturb effects. Data itself may have a bias and data storage media 122 (e.g., storage cells) may have a bias. A bias may be toward binary ones, toward binary zeroes, toward a balance of binary ones and zeroes, toward a certain binary value for certain bits, or the like.

In certain embodiments, an ECC decoder, the bit error module 402 described below, or the like may provide error information for correctable errors to the shift module 304, such as locations of the bits in error, values for the bits in error, and/or other error information. For example, an ECC decoder may provide an error bias to the shift module 304, indicating one or more bits of a data set that are in error, a direction of one or more errors (e.g., from binary ones to binary zeroes, from binary zeroes to binary ones), or the like. An error bias, as used herein, is a representation (e.g., a direction, a drift, a change of an error) of one or more detected bit errors in a data set. In one embodiment, an error bias includes a location or position of a detected bit error in a data set. In another embodiment, an error bias includes a value for a detected bit error. A value for a detected error may include an error corrected value of a bit in error, an error value of the bit in error, or the like.

For example, in one embodiment, an ECC decoder, the bit error module 402, or the like may provide the shift module 304 with an uncorrected data set and an error bias indicating locations of detected bit errors and the shift module 304 may determine a direction of voltage drift, a direction for adjusting a read voltage threshold, a known bias, or the like) by inverting or flipping the bits in those locations. In another embodiment, for example, an ECC decoder, the bit error module 402, or the like may provide the shift module 304 with an error corrected data set and an error bias indicating locations of detected bit errors and the shift module 304 may determine a read bias, an error bias, a direction, or the like by inverting or flipping the bits in those locations.

In one embodiment, the shift module 304 may subtract the proportion of binary ones, zeroes, multi-bit binary symbols, or the like that are expected based on the known bias from the proportion of binary ones, zeroes, multi-bit binary symbols, or the like that are in the data read from the second/different page. For example, instead of determining an exact error bias based on corrected errors, the shift module 304 may expect that read data may have a predefined or expected ratio of binary ones and binary zeroes, due to an ECC encoding of the data or another whitening technique as described below with regard to the whitening module 404 (e.g., an expected bias). Because the data pattern module 302 has determined and/or programmed a data pattern to one or more pages to reduce or minimize a number of possible bit transitions, if the shift module 304 reads more binary ones than expected, the shift module 304 may determine that stored read voltage levels have drifted in one direction, while if the shift module 304 reads more binary zeroes than expected, the shift module 304 may determine that stored read voltage levels have drifted in the opposite direction. The shift module 304 may determine a direction for adjusting a read voltage threshold in the same direction as the determined voltage drift, in an opposite direction as the determined voltage drift, or the like, based on an encoding and/or architecture of the storage cells.

Depending on whether ratios of binary ones are compared or ratios of binary zeroes are compared and whether a high voltage represents a binary one or a binary zero, or other specific architectures of the storage cells, the shift module 304 may invert the difference or perform another transform to determine the direction. In embodiments where an error bias from an Error Correction Code (ECC) decoder is available, the shift module 304 may determine the direction of voltage drift based on one or more bits of the data read from the second/different page that are in error, as indicated by the error bias, a difference between a known bias (e.g., of read data) from an expected bias (e.g., of the data when written/programmed).

In one embodiment, a binary zero is logically represented by a voltage below the read voltage threshold and a binary one is logically represented by a voltage above the read voltage threshold, or vice versa. In one example, data read from the second/different page is stored with a known bias of 0.5, representing that the expected bias of the data read from the second/different page should be about one half binary ones and one half binary zeroes, or direct current (DC) balanced. In this example, if the data read from the second/different page has a read bias of 0.7, meaning that seventy percent of the data bits are binary ones, the shift module 304 may subtract the expected bias, 0.5, from the read bias of the data read from the second/different page, 0.7, for a direction of 0.2. The direction may be the entire result (e.g., "0.2"), the sign of the result (e.g., "positive"), a relationship (e.g., "greater than"), a direction, (e.g., "up"), or another indicator that represents the difference between the expected bias of 0.5 and the read bias of 0.7. The shift module 304, in a further embodiment, may determine a magnitude for an adjustment to a read voltage threshold based on a magnitude of the difference in biases, a number of detected and/or corrected errors, or the like.

In another example, if the read bias of the data read from the second/different page is 0.3, meaning that thirty percent of the data bits are binary ones, the shift module 304, in one embodiment, may subtract the expected bias, 0.5, from the read bias of the data read from the second/different page, 0.3, for a difference of −0.2. In this example, the direction may be the opposite of the first example (e.g., "−0.2," "negative," "less then," "down," or the like).

Because the expected bias may be known, or determined by correcting errors, comparing a read bias relative to a known bias indicates that certain bits which should have satisfied the known bias presently do not, which may be due to a data error or due to changes in the voltage level stored in the storage cells after they were written. In addition, determining that the difference is positive or negative indicates whether the read voltage should be increased or decreased such that a re-read of the data read from the second/different page will result in a read bias that is the same as, or comes closer to the known bias. In one embodiment, the voltage threshold module 306 described below adjusts one or more read voltage thresholds in the same direction as the direction indicated by the shift module 304.

In certain embodiments, the shift module 304 determines a magnitude of an error bias, a magnitude of a difference between a read bias and an expected or known bias, or the like, a magnitude of a voltage drift, or an estimated and/or detected magnitude of such. For example, a magnitude may be based on a difference between the read bias and an expected bias. As another example, a magnitude may represent a ratio of binary ones to binary zeroes. The magnitude may provide an indication to the voltage threshold module 306 of a magnitude or amount of adjustment for one or more read voltage thresholds.

In some embodiments, the shift module 304 determines a read bias for the data read from the second/different page, compares the read bias to an expected bias, and estimates and/or detects the direction of voltage drift and/or of a read voltage threshold adjustment based on a difference between the read bias and the expected bias and based on a Gray code mapping of abodes (e.g., a Gray code encoding type) or another encoding type for the plurality of storage cells. In some embodiments, the shift module 304 determines a number of binary ones and/or binary zeroes in the data read from the second/different page and identifies the direction of voltage drift based on the number of binary zeroes present (e.g., as compared to an expected value) and based on a Gray code mapping of abodes for the plurality of storage cells or another encoding type.

In one embodiment, the shift module 304 determines that a read bias or error bias for data read from the second/different page deviates from an expected bias or original bias with which the data read from the second/different page was originally stored. The read bias or error bias of the data read from the second page deviates from the expected bias when there is a difference between the read bias or error bias and the expected bias. In one embodiment, where the expected bias is exact, such as where the expected bias includes error corrected bit values, the shift module 304 may determine that any difference between a read bias and the expected bias, any error bias, or the like comprises a deviation from the expected bias. In other embodiments, the expected bias may include an average bias, an estimated bias, a detected bias, a distribution of biases, a range of biases, or the like. The shift module 304, in these embodiments, may determine that a read bias or error bias outside of a range or distribution of expected biases, at least a predefined threshold away from an expected bias, or the like deviates from the expected bias and thus a read voltage threshold is to be adjusted.

In certain embodiments, an ECC decoder indicates to the shift module 304 that the read bias of the data deviates from the expected bias by providing an error bias for the data read from the second/different page. The shift module 304 may identify a direction of voltage drift based on the information provided by the ECC decoder. In one embodiment, the difference between the read bias of the data read from the second/different page and the known bias may be a difference in the ratios of binary ones and binary zeroes. In other embodiments, the difference between the bias of the data read from the second/different page and the known bias may be a difference in a binary pattern, a difference in multi-bit binary symbols, or the like.

For example, a word line of storage cells having three pages (e.g., an upper page, a middle page, and a lower page) and using a Gray Code of [111 110 100 000 010 011 001 101] or the like to store data is depicted in FIG. 5A. In response to the lower page of the word line being programmed with zeroes, the word line may now effectively comprise multi-level cells (MLC) storing two-bits of information using a Gray code of [11 10 00 01]. The shift module 304 may read the upper page at a read threshold between the "10" and "00" states and measure a read bias, an error bias, an error rate, a voltage drift, or the like.

If the read bias indicates a shift towards the "00" state, the shift module 304 may estimate and/or detect the direction of voltage drift to be upwards (e.g., higher voltages corresponding to a rightward shift on the data mapping diagram of FIG. 5A). Alternatively, if the read bias indicates a shift towards the "01" state, the shift module 304 may estimate and/or detect the direction of voltage drift to be downwards (e.g., lower voltages corresponding to the leftward shift on the data mapping diagram of FIG. 5A). Thus, the shift module 304 may analyze a read bias of the second/different page to estimate and/or detect the direction of voltage drift.

In some embodiments, the shift module 304 is further configured to identify a number of binary ones and a number of binary zeroes in the data read from the second/different page and to estimate and/or detect the direction of voltage drift based on the number of binary ones and the number of binary zeroes, as described above (e.g., a read bias, an error bias). The shift module 304 may estimate and/or detect the direction of voltage drift by comparing the number of binary ones and/or binary zeroes to an expected value (e.g., a known bias, an expected bias). The shift module 304, in certain embodiments, may calculate an error bias for the word line based on this comparison and estimate and/or detect the direction of voltage drift from this comparison.

In some embodiments, the shift module 304 counts the number of binary ones and/or binary zeroes present on the word line's second/different page. In certain embodiments, the shift module 304 obtains a weighting report indicating a balance, or ratio, of binary zeros to binary ones within the data read from the second/different page. In certain embodiments, an ECC decoder provides an error bias for the data read from the second/different page to the shift module 304. The shift module 304 may estimate and/or detect the direction of voltage shift based on the Gray code encoding type used by the word line and whether the second/different page has more binary ones or binary zeroes than expected.

For example, a word line of storage cells having three pages (e.g., an upper page, a middle page, and a lower page) and using a Gray Code of [111 110 100 000 010 011 001 101] to store data is depicted in FIG. 5A. In response to the upper page of the word line being programmed with zeroes, the word line may now effectively comprise multi-level cells (MLC) storing two-bits of information using a Gray code of [00 10 11 01]. The shift module 304 may read the lower page at a read threshold between the "10" and "11" states and calculate an error bias based on the number of binary zeroes in the read data.

If the lower page has more binary zeroes than expected (e.g., as a result of a "1" to "0" error), the shift module 304 estimates and/or detects the direction of voltage drift to be downwards (e.g., lower voltages corresponding to the leftward shift on the data mapping diagram of FIG. 5A). Alternatively, if the lower page has fewer binary zeroes than expected (e.g., as a result of a "0" to "1" error), the shift module 304 estimates and/or detects the direction of voltage drift to be upwards (e.g., higher voltages corresponding to a rightward shift on the data mapping diagram of FIG. 5A). Thus, the shift module 304 may measure a number of binary zeroes in the data read from the second/different page to estimate and/or detect the direction of voltage drift.

As described in greater detail below with regard to FIG. 4, in certain embodiments, the shift module 304 may read data that includes only a subset of the bits stored by a plurality of storage cells and estimate and/or detect a direction of voltage drift based on the subset of the bits (e.g., just the second/different page of data stored by the plurality of storage cells). For example, data read from the second/different page may include only data values from LSBs (lower pages), only values from MSBs (upper pages), only values from CSBs (middle pages), or the like of the storage cells of the associated word line. In another embodiment, the shift module 304 may determine whether or not a read bias of data read from the second/different page deviates from a known bias based at least partially on an encoding type (e.g., Gray code) used for storage cells of the non-volatile memory media 122, a physical and/or electrical architecture of the storage cells of the non-volatile memory media 122, or the like.

In certain embodiments, having an indication as to which direction to adjust the read voltage threshold provides a significant reduction in time and resources needed to identify a new adjusted read voltage threshold. If the direction in which to make a read voltage threshold adjustment is unknown, identifying a new read voltage threshold may require a labor and time intensive process of trial and error as different possible read voltage thresholds in both directions are set and then tested and then adjusted as needed. Without an indication of direction, the trial and error adjustment process may continue in both directions until a read voltage threshold is found that results in a correctable re-read of the data, or the like.

The voltage threshold module 306, in one embodiment, is configured to adjust one or more read voltage thresholds for a set of storage cells of the non-volatile memory media 122 (e.g., a word line, an erase block, a memory element 123 such as a die, a die plane, a chip, a package, an integrated circuit) based on the estimated and/or detected direction of voltage drift that the shift module 304 determines. For example, in one embodiment, the voltage threshold module 306 may raise or increase a read voltage threshold from a previous read voltage threshold level in response to the shift module 304 detecting more binary ones than expected in the known bias and lower the read voltage threshold in response to fewer binary ones than expected, according to an encoding type of the storage cells (e.g., for the Gray code encoding of FIGS. 5A-5D, with zeroes written to the upper page). While the relative directions may change based on characteristics of the storage cells of the non-volatile memory media 122 and the storage scheme employed (e.g., if zeroes are written to the lower page for the Gray code encoding of FIGS. 5A-5D instead of the upper page), the voltage threshold module 306 adjusts the read voltage threshold to correct or compensate for the difference determined by the shift module 304.

In some embodiments, the voltage threshold module 306 may determine an amount to adjust the read voltage threshold based on a magnitude of the error bias, a magnitude of a difference between the read bias and an expected bias, and/or a magnitude of voltage drift as determined by the shift module 304. In another embodiment, the voltage threshold module 306 may scale or otherwise adjust the magnitude from the shift module 304 and adjust the read voltage threshold the adjusted amount. For example, the voltage threshold module 306, in one embodiment, may adjust the read voltage threshold by several adjustment levels in a single adjustment, based on the magnitude and direction of the voltage drift. In a further embodiment, the voltage threshold module 306 may select an amount to adjust the read voltage threshold based on additional factors such as age, amount of wear, usage history, error history, or other aspects of the non-volatile memory media 122.

The voltage threshold module 306, in one embodiment, adjusts one or more read voltage thresholds individually for a die, die plane, chip, physical erase block (PEB), or other discrete segment of the non-volatile memory media 122, determining, setting, and/or storing a set of one or more read voltage thresholds for each discrete segment or the like. The voltage threshold module 306, in certain embodiments, adjusts multiple read voltage thresholds for each storage cell. For example, in one embodiment, the storage cells of the non-volatile memory media 122 are MLC, TLC, and/or QLC storage cells, with multiple read voltage thresholds per cell (e.g., a 3-bit storage cell may have seven distinct read voltage thresholds). The voltage threshold module 306 may move or adjust each of the multiple read voltage thresholds together based on the estimated and/or detected direction of voltage drift, may move or adjust each of the multiple read voltage thresholds separately/individually, or the like.

In certain embodiments, the data pattern module 302 may determine a data pattern for a first page of one or more word lines of an erase block, the shift module 304 may determine a direction for an adjustment based on data read from a different page of the one or more word lines, and the voltage threshold module 306 may adjust or set one or more read voltage thresholds for an entire erase block, set of erase blocks (e.g., erase blocks having similar retention times since data has been written, program/erase cycle counts, or other similar characteristics), die, die plane, chip, package, integrated circuit, or the like based on the determined direction. Setting or adjusting one or more read voltage thresholds for an entire storage region (e.g., erase block, set of erase blocks, die, die plane, chip, package) based on data read from one or a few pages, in certain embodiments, allows an accurate determination of read voltage thresholds with minimal storage and processing overhead.

The voltage threshold module 306, in one embodiment, adjusts or sets a read voltage threshold using a procedure or command provided by a manufacturer of the non-volatile memory media 122 to adjust a read voltage threshold for a predefined grouping of storage cells, such as a die, die plane, chip, physical erase block, physical page, or the like. For example, in one embodiment, the voltage threshold module 306 may adjust a read voltage threshold by writing a value to a settings register of the non-volatile memory media 122, sending a read voltage threshold parameter to the non-volatile memory media 122, or otherwise communicating an adjustment of a read voltage threshold to the non-volatile memory media 122. The voltage threshold module 306 may communicate the adjustment as an absolute value for a read voltage threshold, an amount to adjust a read voltage threshold, or the like. In a further embodiment, the non-volatile memory media 122 provides a plurality of discrete levels (e.g., between 2 and 15 different levels, or more) to which a read voltage threshold may be adjusted, and the voltage threshold module 306 selects one of the discrete values. In other embodiments, the magnitude of a read voltage threshold adjustment may be defined or recommended by a manufacturer or vendor of the non-volatile memory media 122.

In some embodiments, the shift module 304 is configured to re-read data from the second/different page in response to the voltage threshold module 306 adjusting the read voltage threshold and to estimate and/or detect a new direction of voltage shift. The voltage threshold module 306 may be configured to further adjust the read voltage threshold based on the new direction of voltage shift. Accordingly, the voltage threshold module 306, in one embodiment, may iteratively readjust the read voltage threshold based on a re-estimated and/or re-detected direction of voltage drift until the shift module 304 determines that the read bias and/or error bias of the data read from the second/different page is within expected parameters (e.g., the read bias and/or the error bias are within a predetermined amount of the expected bias), until each of the read voltage threshold levels has been tested, until the data set can be corrected using ECC checkbits, until a maximum read retry threshold has been satisfied, or the like.

In certain embodiments, the voltage threshold module 306 uses a search algorithm to determine the read voltage threshold based on the direction of voltage drift. For example, the range of voltages in the direction of voltage drift from the current read voltage threshold may be the search space for the search algorithm. The voltage threshold module 306, in one embodiment, may use a linear search, a binary search, or the like to determine the read voltage threshold. To check each step as part of the search algorithm, the shift module 304 may re-read the data in the second/different page and re-determine a direction of voltage drift in response to each adjustment, to further the search.

In certain embodiments, the voltage threshold module 306 stops readjusting a read voltage threshold once a retry threshold is satisfied. For example, if an ECC decoder cannot correct a data error and/or if the read bias for the data set continues to deviate from the known bias when a retry threshold for the data set is satisfied, the voltage threshold module 306 may cease making adjustments to the read voltage threshold. The retry threshold may be selected based on a set of possible read voltage threshold levels, or the like. In one embodiment, a retry threshold sets a number of times which the voltage threshold module 306 may adjust a read voltage threshold. In another embodiment, a retry threshold may set an amount of time in which the voltage threshold module 306 may make read voltage threshold adjustments. The non-volatile memory controller 124, in certain embodiments, may take further remedial action in response to the retry threshold being satisfied, such as retiring the storage cells associated with the data set, logically replacing the storage cells associated with the data set, or the like.

Figure 4:
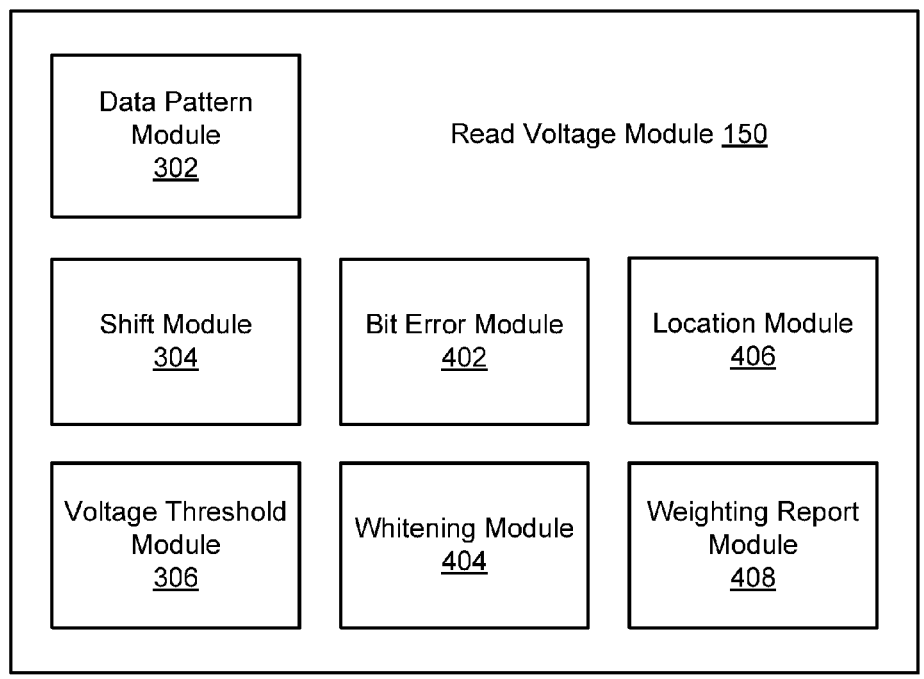
FIG. 4 is a block diagram illustrating another embodiment of a voltage threshold drift module.

FIG. 4 depicts another embodiment of a read voltage module 150. The read voltage module 150 may be substantially similar to the read voltage module 150 described above with regard to FIGS. 1-3. In general, as described above, the read voltage module 150 determines a pattern of data in a first page of a set of memory cells, estimates and/or detects a direction of voltage drift based on data read from a second/different page of the plurality of storage cells, and adjusts a read voltage threshold for the storage cells based on the estimated and/or detected direction of voltage drift. In the depicted embodiment, the read voltage module 150 includes a data pattern module 302, a shift module 304, and a voltage threshold module 306—each of the module 302-306 substantially as described above with regard to FIG. 3. As depicted in FIG. 4, the read voltage module 150 also includes one or more of a bit error module 402, a whitening module 404, a location module 406, and a weighting report module 408. The description herein with regard to the bit error module 402, the whitening module 404, the location module 406, and the weighting report module 408 may apply equally to a bit error component 402, a whitening component 404, a location component 406, and a weighting report component 408.

The bit error module 402, in one embodiment, is configured to identify a dominant bit error type or direction from the data read from the second/different page. As used herein, the dominant bit error type is the more prevalent bit error type among the data read from the second/different page. In certain embodiments, a "0-to-1" bit error will be dominant within the read data, while in other embodiments a "1-to-0" bit error will be dominant. In some embodiments, the bit error module 402 identifies a dominant bit error bias by comparing a number of "0-to-1" bit errors to a number of "1-to-0" bit errors. The bit error module 402 may calculate an error bias based on a comparison of a number of binary ones and/or binary zeroes to an expected value. In some embodiments, the bit error module 402 identifies the dominant bit error by comparing a weighting report for the read data to a threshold or to a model report, the weighting report based on a number of binary ones and binary zeroes in the read data.

In some embodiments, the bit error module 402 determines that a particular bit error or bit error type is dominant in response to the particular bit error or bit error type exceeding the other bit errors or bit error types by at least a predetermined amount or predetermined percentage. Additionally, if one bit error does not exceed the other by the predetermined amount (or predetermined percentage), then the bit error module 402 may determine that there is no dominant bit error or bit error type. In certain embodiments, the bit error module 402 may prevent the voltage threshold module 306 from adjusting the read voltage threshold where there is no dominant bit error as the non-volatile memory media 122 may not benefit from voltage threshold adjustment where the bit error types are balanced (e.g., there may not be a consistent or quantifiable voltage drift).

In certain embodiments, the bit error module 402 may receive error information from an ECC decoder, such as an error bias, locations of the bits in error, values for the bits in error, and/or other error information. For example, the ECC decoder may provide an error bias to the bit error module 402, indicating one or more bits of a data set that are in error, or the like. An error bias, as used herein, is a representation of one or more detected bit errors in a data set, such as the data read from the second/different page. In one embodiment, an error bias includes a location or position of a detected bit error in a data set. In another embodiment, an error bias includes a value for a detected bit error. A value for a detected error may include an error corrected value of a bit in error, an error value of the bit in error, or the like.

In some embodiments, the bit error module 402 provides an indication of the dominant bit error or bit error type to the shift module 304, wherein the shift module 304 determines a direction of voltage drift based on the dominant bit error. In further embodiments, the bit error module 402 may provide an indication that no bit error is dominant to the shift module 304, wherein the shift module 304 determines that no read threshold adjustment is needed in response to no bit error being dominant. While depicted as a separate module, in some embodiments the bit error module 402 may be a sub-module of the shift module 304.

The whitening module 404, in one embodiment, is configured to transform data to adjust an amount of binary ones and binary zeroes in the data. In certain embodiments, as described above, a predetermined data pattern of the data pattern module (e.g., binary zeroes) may be interspersed within data transformed by the whitening module 404. In one embodiment, the whitening module 404 pseudo-randomizes the values of the bits of the data. As used herein, the terms "whiten," "whitening," and "whitened" refer to a transformation of binary data values in a given set of data that shifts the bias of binary ones or zeroes toward a different level or bias (e.g., toward a bias of binary ones, toward a bias of binary zeroes, toward a balance of binary ones and binary zeroes, or the like). In certain situations, the bias shift caused by whitening comprises changing a distribution of binary ones and binary zeroes to a more even or equal distribution. In some embodiments, the whitening module 404 causes a predetermined pattern determined by the data pattern module 302 to not be stored noncontiguous stored in the set of memory cells. In other embodiments, the data pattern module 302 may deactivate or bypass the whitening module 404 to program a predefined data pattern.

In one embodiment, the whitening module 404 transforms the data using a pseudorandom binary sequence (or other known or deterministic pattern) based on a randomization seed determinable by both the whitening module 404 and the location module 406. The randomization seed may be associated with the entire non-volatile memory media 122, with a particular logical or physical erase block of the non-volatile memory media 122, with a particular logical or physical page of the non-volatile memory media 122, or the like. A new randomization seed may be used for a subsequent erase block, page, or the like.

The randomization seed may be determined using one or more known items such as addresses, sequence numbers, dates, times, timestamps, or other information associated with a location of the non-volatile memory media 122 where the data is stored. The randomization seed may then be entered into a pseudorandom number generator to generate the pseudorandom binary sequence. This allows both the whitening module 404 and the location module 406 to access or generate the pseudorandom binary sequence or other deterministic pattern without the overhead of storing additional data.

The whitening module 404, in one embodiment, pseudo-randomizes the values of the bits in a reversible manner, such that the bits of the whitened data may be converted back to their original state. The whitening module 404, in various embodiments, may employ one or more whitening algorithms to make the distribution of states substantially uniform over a large set of cells. In certain embodiments, the whitening module 404 may use encryption, scrambling, or other randomization methods to pseudo-randomize the values of the bits of the data. In one embodiment, the whitening module 404 pseudo-randomizes the data by XORing a pseudorandom binary sequence or other deterministic pattern with the data. In a further embodiment, the whitening module 404 pseudo-randomizes the data using a Galois-style Linear Feedback Shift Register.

In one embodiment, the whitening module 404 pseudo-randomizes the bits of the data by rearranging them into a pseudo-random order based on the randomization seed. While rearranging a data will not change the amount of binary ones or binary zeroes that are in the data, it may more evenly distribute them within the data. The whitening module 404 rearranges the bits of a data according to a reversible algorithm so that the location module 406 can place the bits of the data in their original source order by reversing the rearranging.

In some embodiments, the whitening module 404 may identify a randomization seed used to whiten the predetermined pattern. In one embodiment, the whitening module 404 may provide an indication to the location module 406 of the randomization seed, so that the location module 406 may determine locations of programmed zeroes or of another predefined pattern of data in the programmed page, so that the data pattern module 302 may locate the predefined data pattern in the data, even if the data is user data and not metadata expressly provided by the data pattern module 302 for that purpose. In another embodiment, the whitening module 404 may provide the transformed pattern to the location module 406, wherein the location module 406 determines locations of programmed zeroes or another data pattern in the programmed page.

The location module 406, in one embodiment, is configured to identify locations of data satisfying a predetermined data pattern of the data pattern module (e.g., binary zeroes) interspersed within other data (e.g., user data or workload data from a storage client 116, data transformed by the whitening module 404) programmed to the first page. For data transformed by the whitening module 404, the location module 406 may determine a location based on a known pattern for the transformation (e.g., a randomization seed, a process, an algorithm, or the like). In some embodiments, the location module 406 indicates the locations of the binary zeroes or another predefined data pattern to the shift module 304, and the shift module 304 may be configured to ignore or skip data read from locations not identified by the location module 406 (e.g., data not satisfying the predefined pattern). The location module 406 determines locations of programmed zeroes or another data pattern in a first page (e.g., an upper page, a lower page, a middle page), in multiple pages (e.g., a lower page and an upper page, a lower page and a middle page, an upper page and a middle page), even if the predetermined pattern is not stored consecutively in the pages or memory cells. The predetermined pattern may comprises logical zeroes (e.g., from the perspective of the non-volatile memory controller 124 and/or of the user) or electrical zeroes (e.g., from the perspective of the non-volatile memory media 122), according to the specific encoding scheme used by the non-volatile memory device 120. As described above, the shift module 304 may read data from and base a direction of deviation on data read from data in a second/different page at the determined locations of the data pattern in the other pages.

In some embodiments, the location module 406 determines a randomization seed used by the whitening module 404 for the first page or pages and identifies the locations of programmed binary zeroes, or another data pattern, in the programmed page or pages based on the randomization seed. For example, the location module 406 may identify a sequence used to transform the predetermined pattern via a logical XOR operation, based on the randomization seed and determine the locations of the binary zeroes within the sequence. In other embodiments, the location module 406 may read data from the first page or pages and identify locations of the binary zeroes or other data pattern interspersed within the read data. In some embodiments, the location module 406 provides the locations of programmed zeroes or other data pattern to the shift module 304 which may read data from the second/different page at the provided locations and ignore data read from the other locations.

The weighting report module 408, in one embodiment, is configured to determine a weighting report for the read data based on a number of binary ones and binary zeroes in the read data. In some embodiments, the weighting report module 408 calculates the actual bit error bias of the read page based on the weighting report. In some embodiments, the weighting report module 408 receives the weighting report from a high-speed counter, in the read pipeline 241 of the non-volatile memory media controller 126 or the like, for determining the number of binary ones and/or zeroes in a data set. Such counters may be used to check the whitener balance of the whitening module 404, may be used independently of or without a whitening module 404, or the like. In other embodiments, the weighting report module 408 comprises or is part of an ECC decoder of the non-volatile memory controller 124.

The weighting report module 408 may provide the weighting report and/or a bit error bias determined using the weighting report to the shift module 304, so that the shift module 304 may determine a direction for adjusting a read voltage threshold based on the weighting report, the bit error bias, or the like. While depicted in FIG. 4 as an independent module, in one embodiment the weighting report module 408 is a sub-module of the shift module 304.

FIGS. 5A-D depict embodiments of an encoding model 500 for a set of multi-level storage cells of solid-state storage media storing at least three bits (e.g., TLC storage cells). In some embodiments, the set of multi-level storage cells storing at least three bits comprises an upper page, a middle page, and a lower page, each page storing its own bit of the at least three bits. Each page (e.g., upper, middle, and lower) of a multi-level storage cell may be associated with a page group, the page group comprising a set of at least three pages that are associated with a single set of physical multi-level storage cells.

FIG. 5A depicts an encoding model 500 for the set of multi-level storage cell storing at least three bits, the encoding model 500 mapping the abodes 502-516 of the set of multi-level storage cell to a Gray code 518 used by the multi-level storage cells to encode data. In a Gray code encoding, no more than a single bit transitions or changes values between adjacent states or abodes. As depicted, the multi-level storage cells include eight abodes 502-516 mapped to a Gray code encoding 518 of [111 110 100 000 010 011 001 101]. Thus the abode 502 (e.g., an erase state) corresponds to the binary value of "111", the abode 504 corresponds to the binary value of "110", the abode 506 corresponds to the binary value of "100", and so on. The Gray code encoding 518 contains a plurality of bit transition points 520 where a binary one transitions to a binary zero or vice versa between adjacent abodes or program states.

FIG. 5B depicts the encoding model 500 after the data pattern module 302 programs the upper page of the set of multi-level storage cells to zeroes. Setting the upper page to zeroes restricts the possible abodes to the subset 522, comprising the abodes 508, 510, 512, and 514. As depicted, this creates a two-bit MLC-like mapping or encoding for the remaining pages of the multi-level storage cells. Further, the subset 522 contain fewer bit transition points 520 (e.g., three instead of seven). Here, the middle page includes two bit transition points 520 while the lower page includes one bit transition point 520. Accordingly, the shift module 304 may read the lower page (e.g., the remaining page with the least number of bit transition points 520) of the multi-level storage cells using the read voltage threshold 524 (e.g., a read voltage threshold corresponding to the bit transition point 520) to determine a direction of deviation for the storage cells.

The shift module 304 may analyze the data read from the lower page to identify a dominant bit error, a direction of voltage drift, or the like. In some embodiments, a "1 to 0" error may be dominant indicating a voltage drift to the left (e.g., from abode 512 to abode 510). Accordingly, the voltage threshold module 306 may adjust the read voltage threshold in the same direction as the voltage drift (e.g., to the left, indicting lower voltages) to compensate for the voltage drift. In some embodiments, a "0 to 1" error may be dominant indicating a voltage drift to the right (e.g., from abode 510 to abode 512). Accordingly, the voltage threshold module 306 may adjust the read voltage threshold in the same direction as the voltage drift (e.g., to the right, indicting higher voltages) to compensate for the voltage drift. The overhead penalty for using one page of one word line of an erase block containing the set of multi-level storage cells is very low —approximately 0.2% or less of the total capacity is lost if one page is used, depending on the number of pages in the erase block.

FIG. 5C depicts the encoding model 500 after the data pattern module 302 programs the lower page of the set of multi-level storage cells to zeroes. Setting the lower page to zeroes restricts the possible abodes to the subset 526, comprising the abodes 504, 506, 508, and 510. As depicted, this creates a two-bit MLC-like mapping or encoding of the remaining pages of the multi-level storage cells. Further, the subset 526 contain fewer bit transition points 520 (e.g., three instead of seven). Here, the middle page includes two bit transition points 520 while the upper page includes one bit transition point 520. Accordingly, the shift module 304 may read the upper page (e.g., the remaining page with the least number of bit transition points 520) of the multi-level storage cells using the read voltage threshold 528 (e.g., a read voltage threshold corresponding to the bit transition point 520).

The shift module 304 may analyze the data read from the upper page to identify a dominant bit error, a direction of voltage drift, or the like. In some embodiments, a "1 to 0" error may be dominant indicating a voltage drift to the right (e.g., from abode 506 to abode 508). Accordingly, the voltage threshold module 306 may adjust the read voltage threshold in the same direction as the voltage drift (e.g., to the right, indicting higher voltages) to compensate for the voltage drift. In some embodiments, a "0 to 1" error may be dominant indicating a voltage drift to the left (e.g., from abode 508 to abode 506). Accordingly, the voltage threshold module 306 may adjust the read voltage threshold in the same direction as the voltage drift (e.g., to the left, indicting lower voltages) to compensate for the voltage drift.

FIG. 5D depicts the encoding model 500 after the data pattern module 302 programs both the upper page and the lower page of the set of multi-level storage cells to zeroes. Setting both the upper page and the lower page to zeroes restricts the possible abodes to the subset 530, comprising the abodes 508 and 512. As depicted, this creates a one-bit single level cell (SLC)-like mapping or encoding of the remaining middle page of the multi-level storage cells. Further, the subset 522 contain fewer bit transition points 520 (e.g., one instead of seven). Accordingly, the shift module 304 may read the middle page (e.g., the remaining page) of the multi-level storage cells using the read voltage 532 (e.g., a read voltage threshold corresponding to the bit transition point 520).

The shift module 304 may analyze the data read from the middle page to identify a dominant bit error, a direction of voltage drift, or the like. In some embodiments, a "1 to 0" error may be dominant indicating a voltage drift to the left (e.g., from abode 510 to abode 508). Accordingly, the voltage threshold module 306 may adjust the read voltage threshold in the same direction as the voltage drift (e.g., to the left, indicting lower voltages) to compensate for the voltage drift. In some embodiments, a "0 to 1" error may be dominant indicating a voltage drift to the right (e.g., from abode 508 to abode 510). Accordingly, the voltage threshold module 306 may adjust the read voltage threshold in the same direction as the voltage drift (e.g., to the right, indicting higher voltages) to compensate for the voltage drift.

Because there is only a single bit transition point 520, and each of the storage cells have been programmed to one or the other of two abodes 508, 510, in certain embodiments, the shift module 304 may determine a more accurate direction for a read voltage threshold adjustment when two pages (e.g., the lower page and the upper page) have been programmed with a predefined pattern (e.g., binary zeroes) than when just a single page has been programmed with a predefined pattern. Writing to both the upper page and the lower page, in certain embodiments, amplifies the error bias signal while still providing very low overhead as approximately 0.4% of the total capacity is lost if one upper page and one lower page are used, depending on the number of pages in the erase block.

Figure 6:
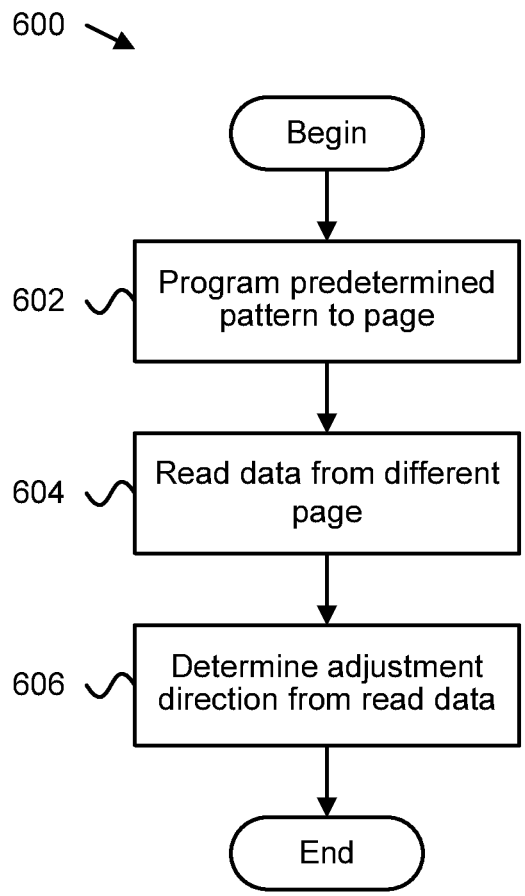
FIG. 6 is a schematic flow chart diagram illustrating one embodiment of a method for detecting voltage threshold drift.

FIG. 6 depicts a method 600 for detecting voltage threshold drift, according to embodiments of the disclosure. In some embodiments, the method 600 is performed using a voltage threshold drift module 150 which may include executable software code stored on a computer readable storage media, logic hardware, or a combination of both executable software code and logic hardware.

The method 600 begins and the data pattern module 302 programs 602 a predetermined pattern to one page of at least three pages of a set of memory cells. The predetermined pattern is configured to reduce a number of possible bit transitions between abodes of the memory cells based on a coding scheme for the set of memory cells. In one embodiment, the predetermined pattern includes all zeroes. In some embodiments, the at least three pages comprise an upper page, a middle page, and a lower page, the one programmed page comprises the upper page. In other embodiments, the at least three pages comprise an upper page, a middle page, and a lower page, the one programmed page comprises the lower page.

In some embodiments, programming 602 the predetermined pattern includes programming the predetermined pattern to one or more additional pages at different locations within an erase block. For example, the data pattern module 302 may program 602 the predetermined pattern at a page located at a beginning of an erase block, a page located at a middle of the erase block, and/or a page located at an end of the erase block.

The shift module 304 reads 604 data from a different page of the at least three pages of the set of memory cells. In some embodiments, the shift module 304 may select a page, from the others of the at least three pages, having the least number of possible bit transitions between abodes of the memory cells as the different page, the number of bit transition being based on a coding scheme for the set of memory cells. In some embodiments, reading 604 the data comprises reading the different page at the read voltage threshold corresponding to a bit transition between abode of the memory cells, for example the transition from a binary one to a binary zero, or vice versa.

The shift module 304 determines 606 an adjustment direction for adjusting a read voltage threshold for the set of memory cells based on the read 604 data. The direction may be represented as a value, a sign (e.g., positive or negative), a relationship (e.g., greater than, less than), a direction (e.g., up, down), or the like. The shift module 304 may further determine the adjustment direction based on a Gray code mapping of abodes (e.g., a Gray code encoding type) for the plurality of storage cells.

In some embodiments, determining 606 the adjustment direction includes determining 606 a read bias for the data read from the second/different page, comparing the read bias to an expected bias, and detecting the direction of voltage drift based on a difference between the read bias and the expected bias. In some embodiments, determining 606 the adjustment direction includes determining 606 a number of binary ones and/or binary zeroes in the data read from the second/different page and identifying the direction of voltage drift based on the number of binary zeroes present (e.g., as compared to an expected value) and based on a Gray code mapping of abodes for the plurality of storage cells. The method 600 ends.

Figure 7:
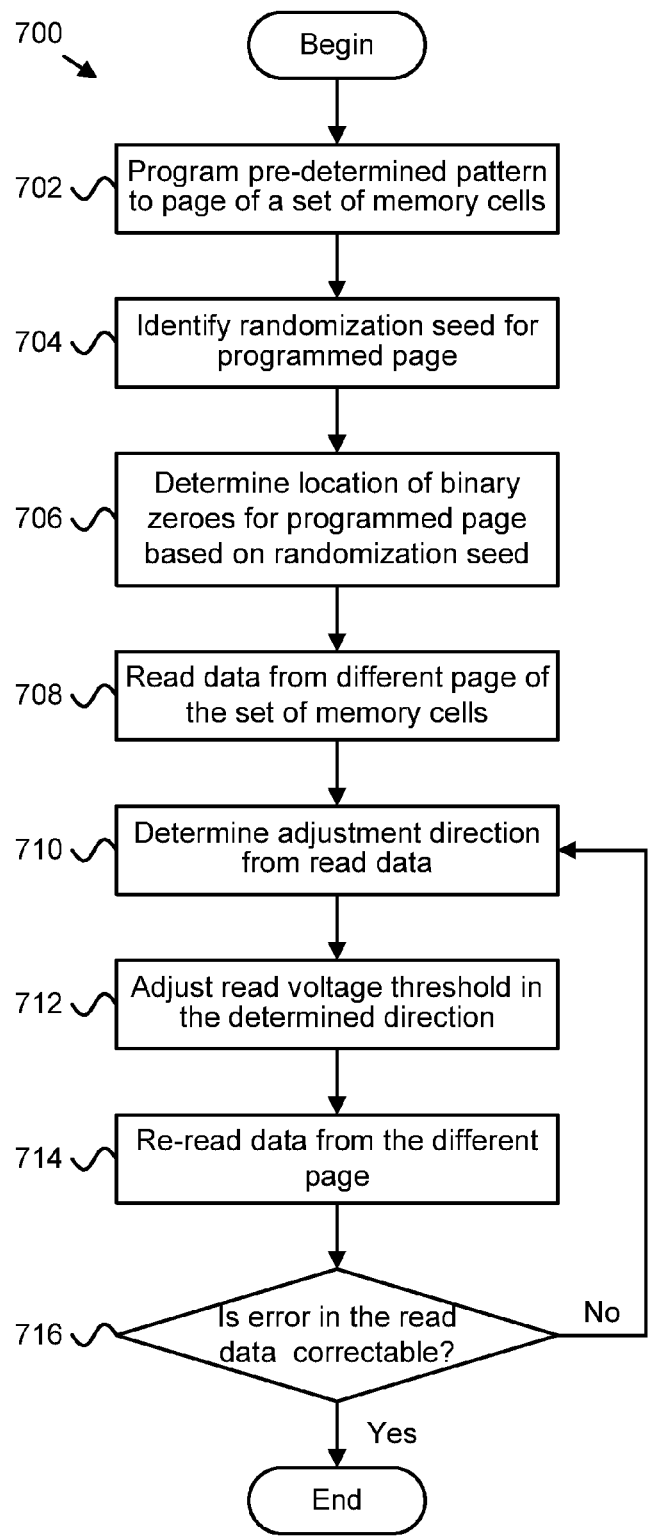
FIG. 7 is a schematic flow chart diagram illustrating a further embodiment of a method for detecting voltage threshold drift.

FIG. 7 depicts a method 700 for detecting voltage threshold drift, according to embodiments of the disclosure. In some embodiments, the method 700 is performed using a voltage threshold drift module 150 which may include executable software code stored on a computer readable storage media, logic hardware, or a combination of both executable software code and logic hardware.

The method 700 begins and the data pattern module 302 programs 702 a predetermined pattern to one page of at least three pages of a set of memory cells. The predetermined pattern is configured to reduce a number of bit transitions between abodes of the memory cells based on a coding scheme for the set of memory cells. In one embodiment, the predetermined pattern includes all zeroes. In some embodiments, the at least three pages comprise an upper page, a middle page, and a lower page, the one programmed page comprises the upper page. In other embodiments, the at least three pages comprise an upper page, a middle page, and a lower page, the one programmed page comprises the lower page.

In some embodiments, programming 702 the predetermined pattern includes programming 702 the predetermined pattern to one or more additional pages at different locations within an erase block. For example, the data pattern module 302 may program 702 the predetermined pattern at a page located at a beginning of an erase block, a page located at a middle of the erase block, and/or a page located at an end of the erase block.

The whitening module 404 and/or the location module 406 identifies 704 a randomization seed for the programmed page, wherein the predetermined pattern is transformed based on the randomization seed prior to being programmed 702 to the page. In one embodiment, the whitening module 404 transforms the data prior to programming using a pseudorandom binary sequence to adjust an amount of binary ones and binary zeroes in the data, the programmed data comprising binary zeroes interspersed within the transformed data, the transformation based on the randomization seed. The randomization seed may be determined using one or more known items such as addresses, sequence numbers, dates, times, or other information associated with a location of the non-volatile memory media 122 where the data is stored.

The location module 406 determines 706 locations of programmed zeroes in the programmed page based on the randomization seed. In some embodiments, the randomization seed may be entered into a pseudorandom number generator to generate the pseudorandom binary sequence. Knowing the pseudorandom binary sequence, the location module 406 determines 706 the location of the programmed zeroes. In some embodiments, the location module 406 identifies the locations of the binary zeroes within a sequence used transform the predetermined pattern via a logical XOR operation. In other embodiments, the location module 406 may read data from the first page and identify locations of the binary zeroes interspersed within the read data.

The shift module 304 reads 708 data from a different page of the at least three pages of the set of memory cells. In some embodiments, the shift module 304 may select a page, from the others of the at least three pages, having the least number of bit transitions between abodes of the memory cells as the different page, the number of bit transition being based on a coding scheme for the set of memory cells. In some embodiments, reading 708 the data comprises reading 708 the different page at the read voltage threshold corresponding to a bit transition between abode of the memory cells, for example the transition from a binary one to a binary zero, or vice versa.

The shift module 304 determines 710 an adjustment direction for adjusting a read voltage threshold for the set of memory cells based on the read data. The direction may be represented as a value, a sign (e.g., positive or negative), a relationship (e.g., greater than, less than), a direction (e.g., up, down), or the like. The shift module 304 may further determine 710 the adjustment direction based on a Gray code mapping of abodes (e.g., a Gray code encoding type) for the plurality of storage cells.

In some embodiments, determining 710 the adjustment direction includes determining 710 a read bias for the data read from the second/different page, comparing the read bias to an expected bias, and detecting the direction of voltage drift based on a difference between the read bias and the expected bias. In some embodiments, determining 710 the adjustment direction includes determining 710 a number of binary ones and/or binary zeroes in the data read from the second/different page and identifying the direction of voltage drift based on the number of binary zeroes present (e.g., as compared to an expected value) and based on a Gray code mapping of abodes for the plurality of storage cells.

The voltage threshold module 306 adjusts 712 a read voltage threshold for the set of memory cells in the determined 710 direction. The voltage threshold module 306, in one embodiment, adjusts 712 the read voltage threshold using a procedure or command provided by a manufacturer of the non-volatile memory media 122 to adjust 712 a read voltage threshold for a predefined grouping of storage cells, such as a die, die plane, chip, physical erase block, physical page, or the like. The voltage threshold module 306 may communicate the adjustment as an absolute value of a read voltage threshold, an amount to adjust the read voltage threshold, or the like.

In some embodiments, the voltage threshold module 306 may determine an amount to adjust the read voltage threshold based on a magnitude of the error bias and/or a magnitude of a difference between the read bias and an expected bias as determined by the shift module 304. In another embodiment, the voltage threshold module 306 may scale or otherwise adjust the magnitude from the shift module 304 and adjust the read voltage threshold the adjusted amount. For example, the voltage threshold module 306, in one embodiment, may adjust the read voltage threshold by several adjustment levels in a single adjustment, based on the magnitude and direction of the voltage drift as determined by the shift module 304.

The shift module 304 re-reads 714 data from the different page of the at least three pages of the set of memory cells. Re-reading 714 the data may include performing a new read of the same page and at the adjusted 712 read voltage threshold. In response to the shift module 304 re-reading 714 the data, the shift module 304 determines 716 whether an error in the data read 714 from the different page is correctable in response to the voltage threshold module 306 adjusting 712 the read voltage threshold. In some embodiments, determining 716 whether an error is correctable includes providing the data read from the different page to an ECC decoder. In response to the error not being correctable, the shift module 304 determines 710 an adjustment direction from the re-read 714 data and the voltage threshold module 306 adjusts 712 the read voltage threshold in the newly determined direction. Otherwise, if the error is correctable, if a retry threshold has been satisfied, or the like, the method 700 ends.

A means for determining and/or programming a predetermined pattern to one page, in various embodiments, may include a data pattern module or component 302, a read voltage module or component 150, a whitening module or component 404, a non-volatile memory controller 124, a non-volatile memory media controller 126, an SML 130, a write pipeline 240, a device driver, a hardware ECC encoder, a software ECC encoder, other logic hardware, and/or other executable code stored on a computer readable storage medium. Other embodiments may include similar or equivalent means for programming a predetermined pattern to one page.

A means for reading data from a second/different page, in various embodiments, may include a shift module or component 304, a read voltage module or component 150, a non-volatile memory controller 124, a non-volatile memory media controller 126, an SML 130, a read pipeline, a device driver, other logic hardware, and/or other executable code stored on a computer readable storage medium. Other embodiments may include similar or equivalent means for reading data from a different page.

A means for determining an adjustment direction, in various embodiments, may include a shift module or component 304, a read voltage module or component 150, a non-volatile memory controller 124, a non-volatile memory media controller 126, an SML 130, a device driver, other logic hardware, and/or other executable code stored on a computer readable storage medium. Other embodiments may include similar or equivalent means for determining an adjustment direction.

A means for identifying a randomization seed for the programmed page, in various embodiments, may include a whitening module or component 404, a location module or component 406, a read voltage module or component 150, a non-volatile memory controller 124, a non-volatile memory media controller 126, an SML 130, a device driver, other logic hardware, and/or other executable code stored on a computer readable storage medium. Other embodiments may include similar or equivalent means for identifying a randomization seed for the programmed page.

A means for determining locations of programmed zeroes, in various embodiments, may include a location module or component 406, a read voltage module or component 150, a non-volatile memory controller 124, a non-volatile memory media controller 126, an SML 130, a device driver, other logic hardware, and/or other executable code stored on a computer readable storage medium. Other embodiments may include similar or equivalent means for determining locations of programmed zeroes.

A means for adjusting a read voltage threshold, in various embodiments, may include a voltage threshold module or component 306, a read voltage module or component 150, a non-volatile memory controller 124, a non-volatile memory media controller 126, an SML 130, a device driver, other logic hardware, and/or other executable code stored on a computer readable storage medium. Other embodiments may include similar or equivalent means for adjusting a read voltage threshold.

A means for re-reading data from the different page, in various embodiments, may include a shift module or component 304, a read voltage module or component 150, a non-volatile memory controller 124, a non-volatile memory media controller 126, an SML 130, a device driver, other logic hardware, and/or other executable code stored on a computer readable storage medium. Other embodiments may include similar or equivalent means for re-reading data from the different page.

A means for determining whether an error in the re-read data is correctable, in various embodiments, may include a shift module or component 304, a read voltage module or component 150, a non-volatile memory controller 124, a non-volatile memory media controller 126, an SML 130, a hardware ECC decoder, a software ECC decoder, a device driver, other logic hardware, and/or other executable code stored on a computer readable storage medium. Other embodiments may include similar or equivalent means for determining whether an error in the re-read data is correctable.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. A method comprising:
   programming a predetermined pattern to one page of at least three pages of a set of memory cells, the pattern having a configuration to reduce a number of bit transitions between abodes of the memory cells based on a coding scheme for the set of memory cells;
   reading data from a different page of the at least three pages; and
   determining a direction for adjusting a read voltage threshold for the set of memory cells based on the read data.

2. The method of claim 1, further comprising adjusting the read voltage threshold for the set of memory cells in the determined direction.

3. The method of claim 2, further comprising:
   re-reading data from the different page; and
   re-adjusting the read voltage threshold for the set of memory cells based on the re-read data, each until an error in the data from the different page becomes correctable.

4. The method of claim 1, further comprising programming a second predetermined pattern to a second page of the at least three pages, wherein reading data from a different page of the at least three pages comprises reading data from a third page of the at least three pages.

5. The method of claim 1, further comprising:
   determining a magnitude for adjusting the read voltage threshold based on the read data; and
   adjusting the read threshold voltage for the set of memory cells based on the determined direction and the determined magnitude.

6. The method of claim 1, wherein the predetermined pattern comprises all zeroes.

7. The method of claim 6, further comprising:
   identifying a randomization seed for the programmed page; and
   determining locations of programmed zeroes in the programmed page, wherein the predetermined pattern is not stored consecutively in the set of memory cells and reading data from the different page comprises reading data from the different page at the determined locations.

8. The method of claim 1, wherein determining the direction for adjusting the read voltage threshold for the set of memory cells comprises:
   determining a weighting report for the read data based on a number of binary ones and binary zeroes in the read data; and
   determining a bit error bias based on the weighting report, wherein the direction for adjusting a read voltage threshold is based on the bit error bias.

9. The method of claim 1, wherein determining the direction for adjusting the read voltage threshold for the set of memory cells comprises calculating a dominant bit error bias for the set of memory cells based on the read data.

10. The method of claim 1, wherein the at least three pages comprise an upper page, a middle page, and a lower page, the one programmed page comprises the upper page, and the different page comprises the lower page.

11. The method of claim 1, further comprising programming the predetermined pattern to one or more additional pages at different locations within an erase block, wherein the direction for adjusting the read voltage threshold is determined based on data read from memory cells storing the one page and from memory cells storing the one or more additional pages.

12. An apparatus comprising:
a data pattern module configured to determine a pattern of data in a first page of a plurality of storage cells comprising a word line in a storage device, the word line configured to store three or more pages of data, the determined pattern of data minimizing a number of bit transitions between program states of the storage cells;
a shift module configured to detect a direction of voltage drift based on data read from a second page of the plurality of storage cells; and
a voltage threshold module configured to adjust a read voltage threshold for the storage cells based on the detected direction of voltage drift.

13. The apparatus of claim 12, further comprising a bit error module configured to identify a dominant bit error from the data read from the second page.

14. The apparatus of claim 12, wherein the voltage threshold module is configured to use the adjusted read voltage threshold for one or more additional pages of the storage device.

15. The apparatus of claim 12, further comprising:
a whitening module configured to transform data to adjust an amount of binary ones and binary zeroes in the data, the predetermined data comprising binary zeroes interspersed within the transformed data; and
a location module configured to identify locations of the binary zeroes interspersed within the transformed data and programmed to the first page based on a pattern for the transformation, wherein the shift module is further configured to ignore data read from locations not identified by the location module.

16. The apparatus of claim 12, wherein the shift module is further configured to identify a number of binary ones and a number of binary zeroes in the data read from the second page and to detect the direction of voltage drift based on the number of binary ones and the number of binary zeroes.

17. A system comprising:
a non-volatile recording medium comprising at least one word line, the word line configured to store at least three pages of data; and
a controller for the non-volatile recording medium, the controller configured to:
program a predetermined pattern to a first page of the at least three pages, the pattern configured to reduce a number of bit transitions between abodes of the memory cells based on a coding scheme for the set of memory cells; and
determine a direction of voltage shift for the word line based on data read from a second page of the word line.

18. The system of claim 17, wherein the controller comprises a hardware controller in communication with the plurality of cells over one or more electrical communication lines to program the predetermined pattern and determine the direction of voltage shift.

19. The system of claim 17, wherein the controller comprises a device driver for a non-volatile recording device comprising the plurality of cells, the device driver comprising computer executable program code stored on a computer readable storage medium, the computer executable program code executable to program the predetermined pattern and determine the direction of voltage shift.

20. An apparatus comprising:
a data pattern component configured to determine a pattern of data in a first page of a plurality of storage cells in a storage device, the determined pattern of data minimizing a number of bit transitions between program states of the storage cells;
a shift component configured to detect a direction of voltage drift based on a number of binary ones and a number of binary zeroes in data read from a second page of the plurality of storage cells; and
a voltage threshold component configured to adjust a read voltage threshold for the storage cells based on the detected direction of voltage drift.

* * * * *